(12) United States Patent
Fujikura et al.

(10) Patent No.: US 11,008,671 B2
(45) Date of Patent: May 18, 2021

(54) NITRIDE CRYSTAL

(71) Applicants: SCIOCS COMPANY LIMITED, Ibaraki (JP); SUMITOMO CHEMICAL COMPANY, LIMITED, Tokyo (JP)

(72) Inventors: Hajime Fujikura, Ibaraki (JP); Taichiro Konno, Ibaraki (JP); Takayuki Suzuki, Ibaraki (JP); Toshio Kitamura, Ibaraki (JP); Tetsuji Fujimoto, Ibaraki (JP); Takehiro Yoshida, Ibaraki (JP)

(73) Assignees: SCIOCS COMPANY LIMITED, Ibaraki (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 33 days.

(21) Appl. No.: 16/420,499

(22) Filed: May 23, 2019

(65) Prior Publication Data

US 2020/0032417 A1 Jan. 30, 2020

(30) Foreign Application Priority Data

Jul. 30, 2018 (JP) .............................. JP2018-142907

(51) Int. Cl.
*C30B 29/40* (2006.01)
*H01L 31/0304* (2006.01)

(52) U.S. Cl.
CPC ...... *C30B 29/403* (2013.01); *H01L 31/03044* (2013.01)

(58) Field of Classification Search
CPC ............................ C30B 29/403; C30B 29/406
See application file for complete search history.

(56) References Cited

U.S. PATENT DOCUMENTS

| 9,779,934 B2 * | 10/2017 | Fujikura ........... H01L 21/02458 |
| 2005/0011432 A1 | 1/2005 | Kitaoka et al. |
| 2007/0128753 A1 | 6/2007 | Oshima |
| 2012/0329245 A1 | 12/2012 | Uematsu et al. |

FOREIGN PATENT DOCUMENTS

| JP | 2005-039248 A | 2/2005 |
| JP | 2007-153664 A | 6/2007 |
| JP | 2016-104693 A | 6/2016 |

* cited by examiner

*Primary Examiner* — Robert M Kunemund
(74) *Attorney, Agent, or Firm* — Pearne & Gordon LLP

(57) ABSTRACT

An object of the present invention is to improve quality of a group-III nitride crystal, and also improve performance and manufacturing yield of a semiconductor device manufactured using the crystal.
Provided is a nitride crystal represented by the composition formula of $In_xAl_yGa_{1-x-y}N$ (satisfying $0 \leq x \leq 1$, $0 \leq y \leq 1$, $0 \leq x+y \leq 1$), with a hardness exceeding 22.0 GPa as measured by a nanoindentation method using an indenter with a maximum load applied thereto being within a range of 1 mN or more and 50 mN or less.

3 Claims, 5 Drawing Sheets

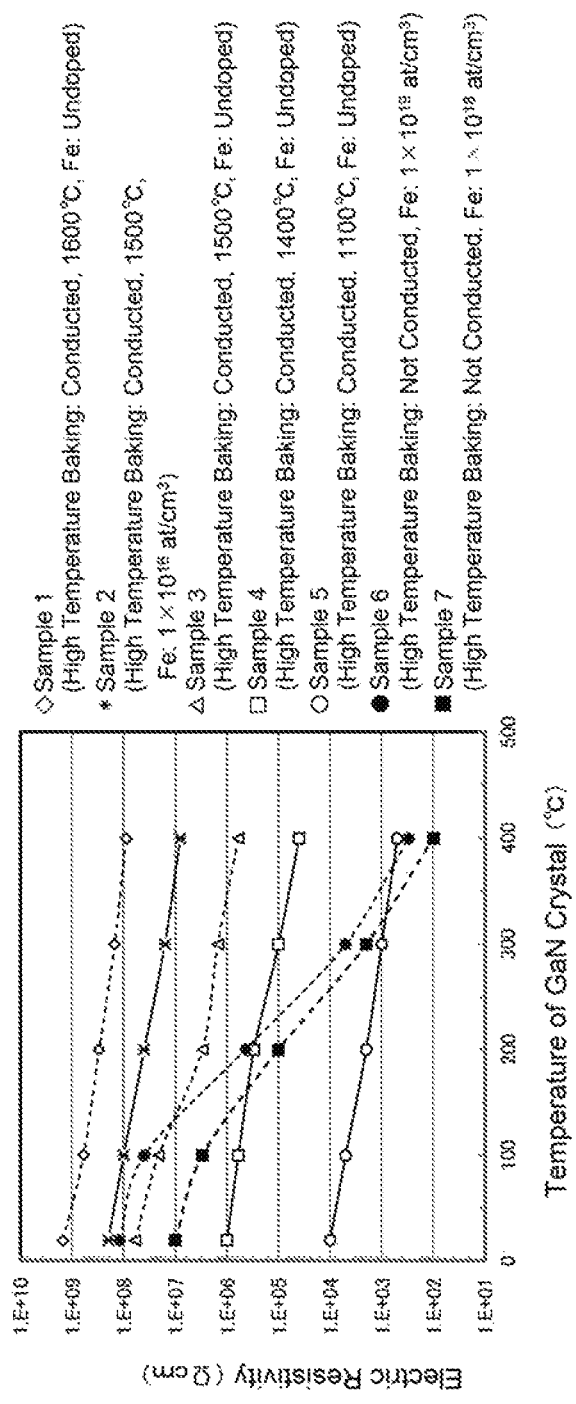

NITRIDE CRYSTAL

TECHNICAL FIELD

The present invention relates to a nitride crystal having semi-insulating or semiconductive properties.

BACKGROUND ART

In the case of manufacturing a semiconductor device such as a light emitting element or a high-speed transistor, for example, a crystal of group-III nitride such as gallium nitride (GaN) may be sometimes used (see, Patent Documents 1 to 3).

CITED DOCUMENT

Patent Document

Patent Document 1 JP 2016-104693 A
Patent Document 2 JP 2007-153664 A
Patent Document 3 JP 2005-39248 A

SUMMARY OF THE INVENTION

Problems to be Solved by the Invention

An object of the present invention is to provide a technology that can improve quality of the aforementioned crystal, and also improve performance and manufacturing yield of a substrate or a semiconductor device manufactured using the crystal.

Means to Solve the Problem

According to an aspect of the present invention, there is provided a nitride crystal (semi-insulating crystal or semiconductor crystal) which is a crystal represented by a composition formula of $In_xAl_yGa_{1-x-y}N$ (satisfying $0 \leq x \leq 1$, $0 \leq y \leq 1$, $0 \leq x+y \leq 1$) with a hardness exceeding 22.0 GPa as measured by a nanoindentation method using an indenter with a maximum load applied thereto being within a range of 1 mN or more and 50 mN or less.

Advantageous Effect of the Invention

According to the present invention, quality of a group-III nitride crystal can be improved, and performance of substrates and semiconductor devices manufactured using the crystal can also be improved, and high yield manufacturing is achieved.

BRIEF DESCRIPTION OF THE DRAWINGS

FIG. 5 is a diagram illustrating an evaluation result of electric resistivity of the GaN-crystal.

BEST MODE OF THE INVENTION

Findings of the Inventors

Figure 1A:
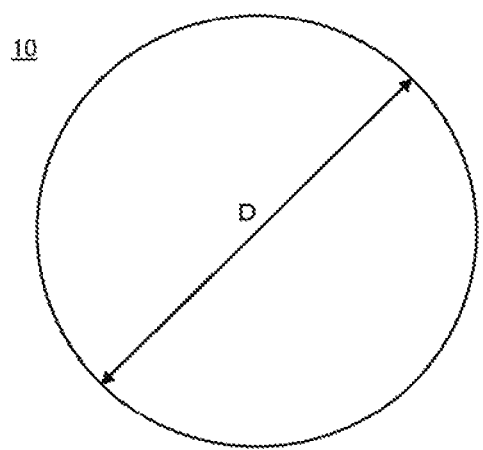
FIG. 1A is a plan view of a GaN-substrate.

The inventors of the present invention previously filed Japanese Patent Application No. 2016-210939. Japanese Laid Open Publication (Japanese Patent Laid-Open No. 2018-070405) discloses an extremely high purity group-III nitride crystal in which each concentration of silicon (Si), boron (B), and iron (Fe) is less than $1 \times 10^{15}$ at/cm$^3$, and each concentration of oxygen (O) and carbon (C) is less than $5 \times 10^{15}$ at/cm$^3$ in the crystal, and which is a crystal represented by a composition formula of $In_xAl_yGa_{1-x-y}N$ (satisfying $0 \leq x \leq 1$, $0 \leq y \leq 1$, $0 \leq x+y \leq 1$), and a manufacturing method thereof are disclosed.

Such a high purity crystal with extremely low concentrations of Si, B, Fe, O, and C is considered to be a novel crystal which has not been disclosed in the prior art documents typified by Patent Documents 1 to 3. The study of the inventors of the present invention reveals that it is difficult to attain such a high purity crystal by a simple combination of crystal growth methods disclosed in Patent Documents 1 to 3, that is, a method of using a high purity gas as a source gas or a carrier gas and a method of coating an inner wall of a crystal growth furnace with a material such as AlN. The study of the inventors of the present invention also reveals that the aforementioned high purity crystal can be obtained only by conducting at least a high temperature baking step disclosed in JP 2018-070405 in a furnace before crystal growth and by optimizing various treatment conditions.

The concentration of impurities in the aforementioned high purity crystal is too low to be detected by SIMS (secondary ion mass spectrometry) which is a representative technique of analyzing impurities at the time of filing the present application. However, the inventors of the present invention conducted high-sensitivity SIMS measurement using Raster change method on this crystal attempting to find a way to further improve the crystal. As a result of measurement, the inventors of the present invention have found that although conducting a high temperature baking step may provide reduction in the concentration of impurities as described above, the concentration of O may reach, for example, $4.5 \times 10^{15}$ at/cm$^3$ or the concentration of C may reach, for example, $3.5 \times 10^{15}$ at/cm$^3$, in some cases.

The inventors of the present invention have intensively studied on a novel problem of further reducing O and C incorporated in the crystal and a method to solve the problem. As a result, the inventors have found that novel operation and effect, that is, alternately conducting an oxidizing sequence and an etching sequence enables further reduction in O and C incorporated in a crystal, the oxidizing sequence adding a trace amount of an oxidizing agent such as oxygen ($O_2$) gas into a treatment atmosphere and the etching sequence adding a predetermined amount of an etching gas such as hydrogen chloride (HCl) gas in the treatment atmosphere during the high temperature baking step.

In addition, the inventors of the present invention have also found that, as a result of an intensive study, the aforementioned reduction in the concentration of impurities in a GaN-crystal can attain a great hardness (firmness) which has never been attained with a conventional GaN-crystal.

The phrase "a crystal has a great hardness" means "the crystal is hard to deform". When an ingot of the GaN-crystal is processed into a substrate, there is a freshly generated stress derived from a processing jig such as a slicer or a surface polishing plate, in addition to originally existing residual stress in the inside of the crystal. A hardness of the crystal smaller relative to the combined stress of them facilitates occurrence of slip motion in the dislocation originally existing in the crystal, occurrence of fresh dislocation in the crystal, or occurrence of further slip motion in the increased dislocation. As the result, the crystal will be plastically deformed. Further, upon progress of such plastic deformation, the crystal easily displays shattered cracks (cracks) or is easily broken. Such a problem may similarly occur not only during fabricating a substrate, but also during fabricating a semiconductor device from the substrate, for example, during a dicing process.

The crystal according to the present invention has an excellent advantage of hardly accompanied by the aforementioned problem because it has such a great hardness that has never been attained with a conventional GaN-crystal. A hardness of a crystal can be measured using a known method such as Vickers test or a nanoindentation method. Among them, a nanoindentation method using an indenter having small tip diameter is advantageous in that a measurement result stable in terms of a hardness may be obtained.

Best Mode of the Invention

The inventors of the present invention attained a crystal according to the present application exemplified by the following aspects for the first time based on these findings.

First Embodiment of the Present Invention (1) Constitution of GaN-Substrate

Figure 1B:
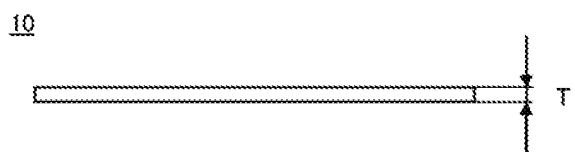
FIG. 1B is a side view of the GaN-substrate.

A crystal in this embodiment is constituted, as an example, as a planar (disc) substrate (wafer) 10 comprising a single crystal of GaN (hereinafter also referred to as GaN-crystal, or GaN-single crystal). FIG. 1A and FIG. 1B show a plan view and a side view of the substrate 10, respectively. The substrate 10 is suitably used for manufacturing a semiconductor device such as a laser diode, an LED, and a high speed transistor, and preferably has a diameter D of 25 mm or more since the substrate having a diameter D of less than 25 mm tends to result in reduced productivity of the semiconductor device. Preferably the substrate 10 has a thickness T of 250 μm or more, since the substrate 10 having a thickness T of less than 250 μm has a low mechanical strength and is more susceptible to cracking of the substrate in a device structure during crystal growth or subsequent device processing, thus making it difficult to maintain a free-standing state. The dimensions described herein is just an example, and this embodiment is not limited thereto.

The substrate 10 is obtained by epitaxially growing a GaN-single crystal on a seed crystal substrate comprising a GaN-single crystal, using a hydride vapor phase epitaxy method (referred to as a HVPE method hereafter), and slicing and making this thick grown crystal ingot self-standing. Alternatively, the substrate 10 may also be obtained by using a GaN layer on the heterogeneous substrate as an underlayer as described in Patent Document 2, and making the GaN layer grow thicker through a nano mask, peeling the resultant from the heterogeneous substrate, and removing a facet-grown crystal on the heterogeneous substrate side.

The substrate 10 in this embodiment is constituted as a semi-insulating substrate having a relatively higher insulation property, that is, having a relatively greater electric resistivity. As the electric resistivity of the GaN-crystal constituting the substrate 10, magnitude of $1 \times 10^6$ Ωcm or more is maintained, for example, under a temperature condition of 20° C. or more and 300° C. or less, and magnitude of $1 \times 10^5$ Ωcm or more is maintained under a temperature condition of exceeding 300° C. and 400° C. or less. For example, magnitude of about $1 \times 10^{10}$ Ωcm is shown as the upper limit of the electric resistivity of the GaN-crystal, although it is not particularly limited. Such a high electric resistivity of the GaN-crystal in this embodiment is attributable to extremely low concentrations of various impurities contained in the crystal, specifically, each concentration of silicon (Si), boron (B), iron (Fe), oxygen (O), and carbon (C) being less than $1 \times 10^{15}$ at/cm³. All of concentrations of these impurities are less than a lower limit of measurement (lower limit of detection) of a currently available representative SIMS analysis. Further, concentrations of O and C are too low to be specifically identified even when SIMS analysis is conducted using Raster change method which is known for its high sensitivity. The Raster change method is a method in which area to be subjected to Raster-scanning is changed in the course of analysis for depth profile using SIMS to distinguish a level of an element contained in a sample from a background level derived from a SIMS apparatus, thereby obtaining a net concentration of the element contained in the sample at high accuracy.

A hardness of the GaN-crystal included in the substrate 10 exceeds 22 GPa as measured by a nanoindentation method using an indenter with a maximum load applied thereto being within a range of 1 mN or more and 50 mN or less. Such a hardness is greater than the hardness the conventional GaN may have attained. It is considered that such a hardness is derived from extremely low concentration of impurities in the crystal, specifically, each concentration of B, Fe, O, and C being less than $1 \times 10^{15}$ at/cm³. Incidentally, measurement of a hardness by a nanoindentation method herein was conducted using a method described in W. C. Oliver and G. M. Pharr, J. Mater. Res. 7, 1564 (1992).

The GaN-crystal in this embodiment has not been grown with a flux method using alkaline metal such as sodium (Na) or lithium (Li) as a flux but grown with HVPE method as described later. Therefore, the GaN-crystal in this embodiment contains substantially no alkaline metal element such as Na or Li. It should be noted that according to SIMS measurement (analysis in the direction of depth) on impurity elements other than Si, B, Fe, O, and C conducted by the inventors of the present invention, none of the elements of arsenic (As), chlorine (Cl), phosphorus (P), fluorine (F), Na, Li, potassium (K), tin (Sn), titanium (Ti), manganese (Mn), chromium (Cr), molybdenum (Mo), tungsten (W), and nickel (Ni) is detected in the GaN-crystal in this embodiment, in other words, the concentrations of these impurities are less than the lower limit of detection. The lower limit of detection of each element in the SIMS measurement at present is as follows:

As: $5 \times 10^{12}$ at/cm³, Cl: $1 \times 10^{14}$ at/cm³, P: $2 \times 10^{15}$ at/cm³, F: $4 \times 10^{13}$ at/cm³, Na: $5 \times 10^{11}$ at/cm³, Li: $5 \times 10^{11}$ at/cm³, K: $2 \times 10^{12}$ at/cm³, Sn: $1 \times 10^{13}$ at/cm³, Ti: $1 \times 10^{12}$ at/cm³, Mn: $5 \times 10^{12}$ at/cm³, Cr: $7 \times 10^{13}$ at/cm³, Mo: $1 \times 10^{15}$ at/cm³, W: $3 \times 10^{16}$ at/cm³, Ni: $1 \times 10^{14}$ at/cm³.

After intensive study by the inventors of the present invention, it is found to be difficult to attain such an extremely low impurity concentration as described above by a conventional crystal growth method, for example, methods disclosed in Patent Documents 1 to 3.

Patent Document 1 discloses that there is a method of suppressing incorporation of O and Si into a GaN crystal wherein a gas containing O and Si is not used as a source gas or a carrier gas and an inner wall of a vessel for crystal growth is coated with a material free from both O and Si. In addition, it also discloses that there is a method of suppressing incorporation of C into a GaN-crystal wherein a member made of carbon is not used as an inner-furnace member and a C-containing gas is not used as a source gas or a carrier gas.

Patent Document 2 discloses that a combination of the following techniques enables reduction of the concentration of impurities contained in the GaN-crystal: to bring a source gas or a carrier gas into contact with a Ga melt for a long period of time to let the Ga melt capture impurities contained in the gas in HVPE method; to pre-form a metal nano mask on a seed crystal substrate, the metal nano mask including a plurality of micropores having ability to capture impurities; and to shorten a growth period in the facet-plane state where impurities are easily incorporated to precociously shift toward a growth on a plane where impurities are hardly incorporated.

Patent Document 3 discloses a method of using a high purity gas as a source gas or a carrier gas and a method of coating a surface of an inner-furnace member with a material such as AlN or the like. It also discloses that coating the surface of the inner-furnace member results in reduced incorporation of Si and O into the GaN-crystal.

However, these documents do not attain the aforementioned high purity crystal in which all of Si, B, Fe, O, and C exist in extremely low concentration. As is obvious from comparison of samples 8, 12, and 17 with other samples explained in Examples described later, it is difficult to obtain a high purity crystal in which all of Si, B, Fe, O, and C exist in extremely low concentration by simply combining the methods described in these documents. As is obvious from comparison of these samples, it is required at least to conduct a high temperature baking step in a furnace before a crystal growth step and to appropriately select the treatment condition, in order to attain a high purity crystal wherein each concentration of Si, B, and F is less than $1 \times 10^{15}$ at/cm$^3$ and each concentration of O and C is less than $5 \times 10^{15}$ at/cm$^3$.

Further, in order to obtain a crystal in which each concentration of O and C as well as Si, B, and Fe is less than $1 \times 10^{15}$ at/cm$^3$ like a crystal according to the present invention, the aforementioned high temperature baking step should be further improved. Specifically, an oxidizing sequence and an etching sequence are required to be alternately repeated in the high temperature baking step. Procedures and treatment conditions therefor will be hereinafter explained in detail.

(2) GaN-Substrate Manufacturing Method

A manufacturing method of the substrate 10 in this embodiment will be specifically explained hereinafter.

First, a constitution of an HVPE apparatus 200 used for growing the GaN-crystal will be explained in detail, with reference to FIG. 2. The HVPE apparatus 200 includes a reaction vessel 203 formed into a cylindrical shape, for example. The reaction vessel 203 has a sealed structure so as not to allow entrance of atmospheric air outside thereof or a gas contained in a glove box 220 described later. In the reaction vessel 203, a reaction chamber 201 is formed in which the crystal growth is conducted. In the reaction chamber 201, a susceptor 208 is provided which retains a seed crystal substrate 20 comprising a GaN-single crystal. The susceptor 208 is connected to a rotary axis 215 of a rotary mechanism 216, and thus rotatably constituted. In addition, the susceptor 208 includes an internal heater 210. The internal heater 210 is constituted so that its temperature can be controlled separately from the temperature of a zone heater 207 described later. Moreover, the upstream side and the periphery of the susceptor 208 are covered with a heat shield wall 211. Since the heat shield wall 211 is provided, a gas other than the gas supplied from nozzles 249a to 249c described later will not be supplied to the seed crystal substrate 20.

Figure 3:
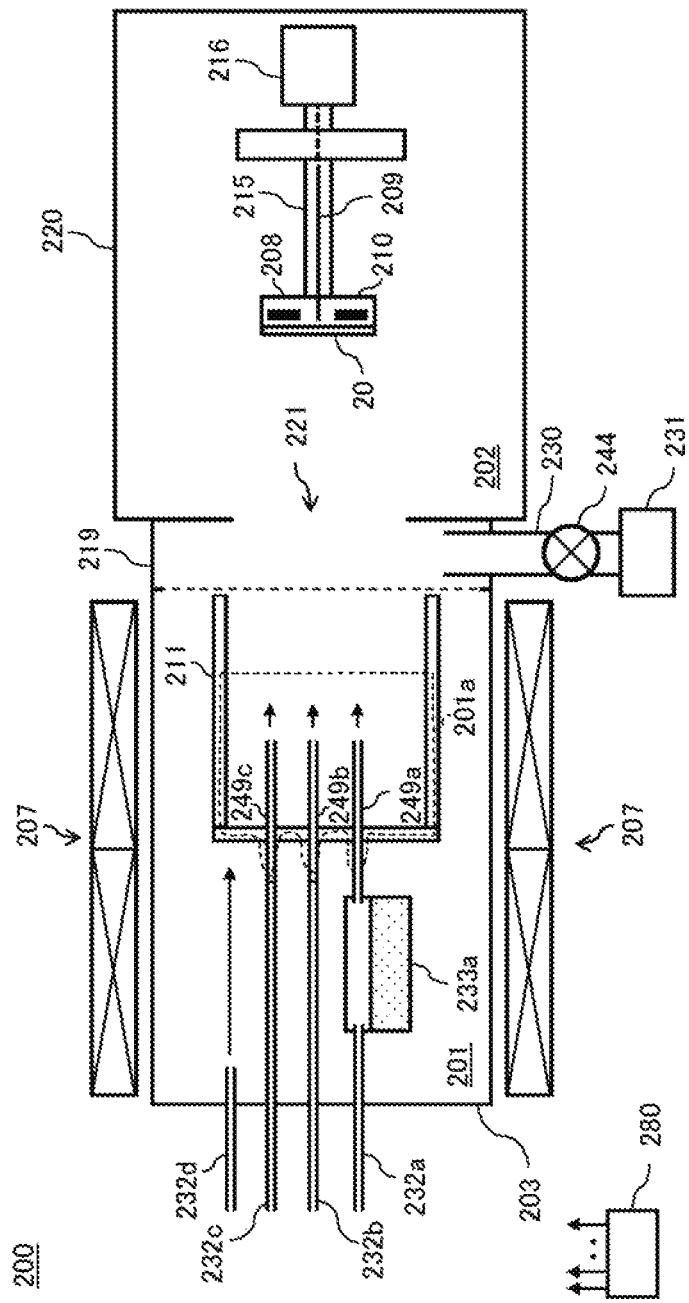
FIG. 3 is a schematic block diagram of the vapor phase growth apparatus, illustrating a reaction vessel whose furnace port being opened.

The reaction vessel 203 is connected to the glove box 220 through a cylindrical metal flange 219 comprising SUS or the like. The glove box 220 is also has an air-tight structure so as not to let the atmospheric air be incorporated therein. An exchanging chamber 202 provided in the glove box 220 is continuously purged with high purity nitrogen (hereinafter also simply referred to as N$_2$ gas), and thus the concentrations of oxygen and water are maintained at low values. The glove box 220 includes a transparent acrylic wall, a plurality of rubber gloves connected to holes penetrating the wall, and a pass box to put an object in and out of the glove box 220. The pass box includes an evacuation mechanism and a N$_2$ purge mechanism, in which the atmospheric air is replaced with N$_2$ gas so that an object can be put in and out of the glove box 220 without letting the atmospheric air containing oxygen be incorporated therein. As shown in FIG. 3, the crystal substrate is put in and out of the reaction vessel 203, while the port of the metal flange 219, that is, the furnace port 221 is opened. In this way, re-contamination of the surface of each member in the reaction vessel 203 and adherence of the atmospheric air and the gas containing various impurities described above to the surface of the member may be prevented, the member being after completion of cleaning and modification through a high temperature baking step described later. Impurities referred herein contain at least any one of O$_2$ and moisture (H$_2$O) derived from atmospheric air; organics containing C, O, and hydrogen (H), Na, and K derived from human body or the like; As, Cl, P, and F derived from a gas used in a crystal growth step or a device fabricating step; Fe, Sn, Ti, Mn, Cr, Mo, W, and Ni derived from metallic member inside the furnace; and the like.

The reaction vessel 203 includes, at its one end, a gas supply pipe 232a for supplying HCl gas into a gas generator 233a described later, a gas supply pipe 232b for supplying ammonia (NH$_3$) gas into the reaction chamber 201, a gas supply pipe 232c for supplying HCl gas for high temperature baking and normal baking into the reaction chamber 201, and a gas supply pipe 232d for supplying nitrogen (N$_2$) gas into the reaction chamber 201, respectively. The gas supply pipes 232a to 232c are also constituted so as to be able to supply hydrogen (H$_2$) gas and N$_2$ gas as carrier gases in addition to HCl gas and NH$_3$ gas. The gas supply pipes 232a to 232c are also constituted so as to be able to supply a trace amount of oxygen (O$_2$) gas in addition to these gases. The gas supply pipes 232a to 232c include a flow rate controller and a valve (both not shown) for each type of these gases, so as to conduct flow rate control and supply/stop of various gases individually for each type of gas. In addition, the gas supply pipe 232d also includes a flow rate controller and a valve (both not shown). N$_2$ gas supplied from the gas supply pipe 232d is used to purge the upstream side and the periphery of the heat shield wall 211 in the reaction chamber 201 to maintain cleanliness of the atmosphere of these portions.

HCl gas supplied from the gas supply pipe 232c and H$_2$ gas supplied from the gas supply pipes 232a to 232c serve as cleaning gases for cleaning the surface of the members in the reaction chamber 201 (particularly, the inside of the heat shield wall 211) in an etching sequence of a high temperature baking step described later and an normal baking step and also serve as modification gases for modifying the surface to a surface with less possibility to release impurities. A trace amount of $O_2$ gas supplied from the gas supply pipes 232a to 232c serves as a gas which promotes the aforementioned cleaning and modification in an oxidizing sequence in the high temperature baking step described later. The mechanism of such promotion is unknown, but it is considered that since a trace amount of $O_2$ gas added into an atmosphere in the high temperature baking step described later, organics attached to the inner-furnace member react with the $O_2$ gas to generate volatiles such as $H_2O$ and $CO_2$, thereby the attached organics becoming easily detached. $N_2$ gas supplied from the gas supply pipes 232a to 232c serves to appropriately regulate a blowout flow velocity of HCl gas, $H_2$ gas and $O_2$ gas being ejected from the tip of the nozzles 249a to 249c so that a desired portion of the reaction chamber 201 (particularly, the inside of the heat shield wall 211) is appropriately cleaned in each baking step.

HCl gas introduced from the gas supply pipe 232a serves as a reactant gas that reacts with a Ga-source to produce GaCl gas which is a halide of Ga, that is, a Ga source gas, in a crystal growth step described later. Further, $NH_3$ gas supplied from the gas supply pipe 232b serves as a nitriding agent which reacts with GaCl gas to grow GaN, a nitride of Ga, on the seed crystal substrate 20, that is, as an N source gas, in the crystal growth step described later. Hereinafter, GaCl gas and $NH_3$ gas may be collectively referred to as a source gas. $H_2$ gas and $N_2$ gas supplied from the gas supply pipes 232a to 232c serve to appropriately regulate the blowout flow velocity of the source gas which is ejected from the tips of the nozzles 249a to 249c to direct the source gas toward the seed crystal substrate 20, in the crystal growth step described below.

On the downstream side of the gas supply pipe 232a, as described above, the gas generator 233a which contains the Ga melt as a Ga-source is provided. The gas generator 233a is provided with a nozzle 249a which supplies GaCl gas produced by the reaction between HCl gas and the Ga melt to a principal surface of the seed crystal substrate 20 retained on the susceptor 208. On the downstream side of the gas supply pipes 232b, 232c, nozzles 249b, 249c are provided, which supply various gases supplied from these gas supply pipes toward the principal surface of the seed crystal substrate 20 retained on the susceptor 208. Each of the nozzles 249a to 249c is constituted so as to penetrate the upstream side of the heat shield wall 211.

The gas supply pipe 232c is constituted to be able to supply, in addition to HCl gas, $H_2$ gas, and $N_2$ gas, a Fe-containing gas such as ferrocene ($Fe(C_5H_5)_2$, abbreviated as $Cp_2Fe$) gas or iron (III) trichloride ($FeCl_3$) gas, a Si-containing gas such as silane ($SiH_4$) gas or dichlorosilane ($SiH_2Cl_2$) gas, or a Mg-containing gas such as bis(cyclopentadienyl)magnesium ($Mg(C_5H_5)_2$, abbreviated as $Cp_2Mg$) gas, as a dopant gas.

The metal flange 219 provided on the other end of the reaction vessel 203 is provided with an exhaust pipe 230 for exhausting the reaction chamber 201. The exhaust pipe 230 includes an APC valve 244 as a pressure regulator and a pump 231, in this order from upstream side. Instead of the APC valve 244 and the pump 231, a blower including a pressure regulation mechanism may be used.

The outer circumference of the reaction vessel 203 is provided with a zone heater 207 which heats the inside of the reaction chamber 201 to a desired temperature. The zone heater 207 includes at least two heaters, i.e., one for an upstream side portion surrounding the gas generator 233a and one for a downstream side portion surrounding the susceptor 208, each heater having a temperature sensor and a temperature regulator (both not shown) so as to enable individual regulation of temperature within a range from a room temperature to 1200° C.

As described above, the susceptor 208 retaining the seed crystal substrate 20 includes the internal heater 210, a temperature sensor 209, and a temperature regulator (not shown) separately from the zone heater 207, so as to enable temperature regulation at least in a range from room temperature to 1600° C. In addition, the upstream side and the periphery of the susceptor 208 are, as described above, enclosed by the heat shield wall 211. Regarding the heat shield wall 211, it is necessary to use a limited member for at least a surface (inner circumference surface) facing the susceptor 208 so as not to generate impurities, as described later. However, there is no limitation to the member to be used for the surface other than the inner circumference surface (outer circumference surface) so long as it is resistant to a temperature of 1600° C. or more. In the heat insulation wall 211, at least a portion excluding the inner circumference surface may include, for example, a highly thermal resistant, non-metallic material such as carbon or silicon carbide (SiC) or tantalum carbide (TaC), or a highly thermal resistant, metallic material such as Mo or W, and may be designed as a constitution including laminated plate-like reflectors. Using this constitution, the temperature of the outside of the heat shield wall 211 may be suppressed to 1200° C. or less even when the temperature of the susceptor 208 is 1600° C. Quartz may be used for each member constituting the upstream side portion such as the reaction vessel 203, the gas generator 233a, and the gas supply pipes 232a to 232d in this constitution, since this temperature is equal to or less than a softening point of quartz.

In the reaction chamber 201, surfaces of members which form an area heated to 900° C. or more during the crystal growth step described later, which is an area (high-temperature reaction area) 201a possibly contacted with the gas supplied to the seed crystal substrate 20, contain a material having heat resistance to at least 1600° C. or more and not containing quartz ($SiO_2$) and B. Specifically, surfaces of an inside wall of a portion of the heat shield wall 211 located on the upstream side of the susceptor 208, internally penetrating portions of the nozzles 249a to 249c penetrating through the heat shield wall 211, a portion outside of the heat shield wall 211 which is to be heated to 900° C. or more in the crystal growth step, the susceptor 208, and the like may contain a heat resistant material such as alumina ($Al_2O_3$), SiC, graphite, TaC, or pyrolytic graphite. It goes without saying that the portion surrounding the internal heater 210, which is not included in the area 201a, is also required to have heat resistance to at least 1600° C. or more. The reason why the members forming the area 201a or the like are required to have such a high heat resistance is because the high temperature baking step is conducted before conducting the crystal growth step as described later.

Members included in the HVPE apparatus 200, such as various valves and a flow rate controllers included in the gas supply pipes 232a to 232d, the pump 231, the APC valve 244, the zone heater 207, the internal heater 210, and the temperature sensor 209 are respectively connected to a controller 280 constituted as a computer.

Next, an example of the treatment for epitaxially growing the GaN-single crystal on the seed crystal substrate 20 using the aforementioned HVPE apparatus 200 will be explained in detail with reference to FIG. 2. In the following explanation, the operation of each part constituting the HVPE apparatus 200 is controlled by the controller 280.

(High Temperature Baking Step)

This step is conducted when the inside of the reaction chamber 201 and the inside of the exchanging chamber 202 are exposed to the atmospheric air, since maintenance of the HVPE apparatus 200 or loading of the Ga-source into the gas generator 233a is conducted. Before conducting this step, it should be confirmed that air tightness of the reaction chamber 201 and the exchanging chamber 202 is secured. After the air tightness is confirmed, the inside of the reaction chamber 201 and the inside of the exchanging chamber 202 are respectively replaced with $N_2$ gas. Thereafter, the surfaces of various members constituting the reaction chamber 201 are subjected to heat treatment while the inside of the reaction vessel 203 is in a predetermined atmosphere. The treatment is conducted while the seed crystal substrate 20 is not loaded into the reaction vessel 203, and Ga-source is loaded into the gas generator 233a.

In this step, the temperature of the zone heater 207 is regulated to the temperature similar to the temperature in the crystal growth step. Specifically, the temperature of an upstream-side heater surrounding the gas generator 233a is set to a temperature from 700 to 900° C., while a downstream-side heater surrounding the susceptor 208 is set to a temperature from 1000 to 1200° C. Further, the temperature of the internal heater 210 is set to a predetermined temperature of 1500° C. or more. As described later, in the crystal growth process, since the internal heater 210 is off or set to the temperature of 1200° C. or less, the temperature of the high temperature reaction area 201a becomes 900° C. or more and less than 1200° C. On the other hand, in the high temperature baking step, since the temperature of the internal heater 210 is set to the temperature of 1500° C. or more, the temperature of the high temperature reaction area 201a becomes 1000 to 1500° C. or more, the temperature in the neighborhood of the susceptor 208 on which the seed crystal substrate 20 is mounted becomes as high as 1500° C. or more, and, as for other location, the temperature at each location becomes at least 100° C. or more higher than the temperature during the crystal growth step. The portion in the high temperature reaction area 201a, where the temperature is 900° C. which is lowest during conducting the crystal growth step, specifically the portion upstream of the nozzles 249a to 249c in the inside of the heat shield wall 211, is the portion where an adhered impurity gas is most difficult to remove. Since the temperature of the internal heater 210 is set to 1500° C. or more so that the temperature at this site becomes at least 1000° C. or more, the effect of cleaning and modification treatment described later, that is, the effect of reducing impurities in the GaN-crystal to be grown can be sufficiently attained. When the temperature of the internal heater 210 is set to a temperature of less than 1500° C., the temperature at any point in the high temperature reaction area 201a cannot be sufficiently raised, and thus the effect of cleaning and modification treatment described later, that is, the effect of reducing impurities in the GaN-crystal can be hardly attained.

The upper limit of the temperature of the internal heater 210 in this step depends on the ability of the heat shield wall 211. So long as the temperature of the quartz parts and the like on the outside of the heat shield wall 211 can be suppressed within a range not exceeding their heat resistant temperature, the higher the temperature of the internal heater 210, the more easily the effect of cleaning and modification treatment in the reaction chamber 201 can be obtained. When the temperature of the quartz parts on the outside of the heat shield wall 211 exceeds their heat resistant temperature, maintenance frequency and the cost of the HVPE apparatus 200 are increased in some cases.

Further, in this step, after the temperatures of the zone heater 207 and the internal heater 210 have reached the aforementioned predetermined temperatures, $H_2$ gas is supplied from each of the gas supply pipes 232a, 232b, for example, at a flow rate of about 3 to 5 slm. Moreover, a sequence (oxidizing sequence) supplying $N_2$ gas, for example, at a flow rate of about 3 to 5 slm along with $O_2$ gas, for example, at a flow rate of about 0.005 to 0.25 slm, and a sequence (etching sequence) supplying HCl gas, for example, at a flow rate of about 0.3 to 4 slm along with $H_2$ gas, for example, at a flow rate of about 1 to 5 slm, from a gas supply pipe 232c, are alternately repeated. In addition, $N_2$ gas is supplied from the gas supply pipe 232d, for example, at a flow rate of about 10 slm. Each period for conducting the etching sequence and the oxidizing sequence is preferably about 1 to 15 minutes. In this step, baking is conducted in the reaction chamber 201 while a cycle of alternately conducting these sequences is repeated for a predetermined number of times. In the repeated cycles, the sequence to be conducted at the end is preferably an etching sequence. Since the supply of $H_2$ gas, HCl gas, and $O_2$ gas is started at the aforementioned timing, that is, after a temperature in the reaction chamber 201 is raised, an amount of a gas which flows out wastefully without contributing to the cleaning and modification treatment described later can be reduced, and a cost for the treatment of the crystal growth can be reduced.

Further, since this step is conducted while operating the pump 231, and at this time, an opening degree of the APC valve 244 is regulated, the pressure in the reaction vessel 203 is maintained, for example, at a pressure of 0.5 atm or more and 2 atm or less. Also, since this step is conducted while exhausting the reaction vessel 203, removal of the impurities from the reaction vessel 203, that is, cleaning of inside of the reaction vessel 203 can be efficiently conducted. When the pressure in the reaction vessel 203 is less than 0.5 atm, it becomes difficult to attain the effect of cleaning and modification treatment described later. In addition, when the pressure in the reaction vessel 203 exceeds 2 atm, the members in the reaction chamber 201 will receive excessive etching damage.

Further, in etching sequence in this step, a partial pressure ratio of HCl gas to $H_2$ gas (HCl partial pressure/$H_2$ partial pressure) in the reaction vessel 203 is, for example, set to 1/50 to 1/2. When the aforementioned partial pressure ratio is smaller than 1/50, it becomes difficult to attain the effect of cleaning and modification treatment in the reaction vessel 203. In addition, when the partial pressure ratio exceeds 1/2, the members in the reaction chamber 201 will receive excessive etching damage.

Further, in oxidizing sequence in this step, a partial pressure ratio of $O_2$ gas to $H_2$ gas and $N_2$ gas ($O_2$ partial pressure/$H_2$+$N_2$ partial pressure) in the reaction vessel 203 is, for example, set to $1/10^3$ to $50/10^3$. Namely, a flow rate of $O_2$ gas to be supplied into the reaction vessel 203 is set to be within a range of 0.1 to 5% of the total flow rate of other gases ($H_2$ gas, $N_2$ gas) to be supplied into the reaction vessel 203. When the partial pressure ratio is smaller than $1/10^3$, it becomes difficult to attain the effect of both promoting cleaning and promoting modification treatment in the reaction vessel 203. Further, when the aforementioned partial pressure ratio exceeds $50/10^3$, for example, O components remaining in the reaction vessel 203 in a crystal growth step described later will increase, which may result in increased O concentration in the GaN-crystal to be grown on the seed crystal substrate 20.

The partial pressure can be controlled by regulating the flow rate of the flow rate controller provided to the gas supply pipes 232a to 232c.

In this step, when each of the oxidizing sequence and etching sequences is conducted for one minute, an alternate oxidizing-and-etching cycle shall be repeated 20 times or more. Alternatively, when each of the oxidizing sequence and the etching sequences is conducted for 15 minutes, an alternate oxidizing-and-etching cycle shall be repeated twice or more. As a result, the surfaces of the various members forming at least the high temperature reaction area 201a in the reaction chamber 201 can be cleaned and the impurities adhering to the surfaces can be removed. Then, since the surfaces of these members are maintained at the temperature 100° C. or more higher than the temperature in the crystal growth step described later, release of the impurity gas from these surfaces can be promoted and these surfaces can be modified to the surfaces where the release of impurities such as Si, B, Fe, O, and C hardly occurs under the temperature and pressure conditions in the crystal growth step. In this step, the total period for conducting the oxidizing sequence and the etching sequence is preferably 30 minutes or more, more preferably 60 minutes or more, and still more preferably 120 minutes or more. Further, the cycle is repeated preferably twice or more, more preferably 4 times or more, and still more preferably 8 times or more. When the time for conducting the respective sequences becomes less than 30 minutes in total or when the repetition time of the cycle is less than twice, the effect of cleaning and modification treatment described herein becomes insufficient in some cases. In addition, when the time for conducting this step exceeds 300 minutes in total, the members which form the reaction area 201a will receive excessive damage.

When $H_2$ and HCl gas are supplied into a reaction vessel 203, the supply of $NH_3$ gas into the reaction vessel 203 is not conducted. In this step, when $NH_3$ gas is supplied into the reaction vessel 203, it becomes more difficult to obtain the effect of the aforementioned cleaning and modification treatment, particularly the effect of the modification treatment.

Further, when $H_2$ gas and HCl gas are supplied into the reaction vessel 203, chlorine ($Cl_2$) gas may be supplied in place of HCl gas. In this case, the effect of the aforementioned cleaning and modification treatment can be similarly obtained.

Further, when $O_2$ gas is supplied into the reaction vessel 203, an oxidizing agent (an O-containing gas) such as steam ($H_2O$ gas) or carbon monoxide (CO) gas may be supplied in place of $O_2$ gas. In this case, the effect of promoting both of the aforementioned cleaning and modification treatment can be similarly obtained.

In addition, when $H_2$ gas and HCl gas are supplied into the reaction vessel 203, $N_2$ gas may be added as a carrier gas from the gas supply pipes 232a to 232c. Since the blowout flow velocity of the gas from the nozzles 249a to 249c can be regulated by adding $N_2$ gas, generation of a portion where the aforementioned cleaning and modification treatment is incomplete can be prevented. Rare gas such as Ar gas or He gas may be supplied in place of $N_2$ gas.

Upon completion of the aforementioned cleaning and modification treatment, output of the zone heater 207 is reduced, the temperature in the reaction vessel 203 is decreased, for example, to 200° C. or less, that is, the temperature is decreased to a temperature at which the seed crystal substrate 20 can be loaded into the reaction vessel 203. Further, the supply of $H_2$ gas and HCl gas into the reaction vessel 203 is stopped and the inside of the reaction vessel is purged with $N_2$ gas. Upon completion of the purge in the reaction vessel 203, the opening degree of the APC valve 244 is regulated so that the pressure in the reaction vessel 203 becomes atmospheric pressure or slightly higher than atmospheric pressure, while maintaining the supply of $N_2$ gas into the reaction vessel 203.

(Normal Baking Step)

The aforementioned high temperature baking step is conducted when the inside of the reaction chamber 201 and the inside of the exchanging chamber 202 are exposed to the atmospheric air. However, when the crystal growth step is conducted, ordinarily, the inside of the reaction chamber 201 and the inside of the exchanging chamber 202 are not exposed to atmospheric air before, during, and after the crystal growth step. Accordingly, the high temperature baking step is not required. In this case, since the crystal growth step is conducted, polycrystalline GaN will adhere to the surfaces of the nozzles 249a to 249c, the surface of the susceptor 208, and the inside wall of the heat shield wall 211. When the subsequent crystal growth step is conducted with the polycrystalline GaN remaining, polycrystalline GaN powder, Ga droplets or the like, scattered upon separation from the polycrystal, will adhere to the seed crystal substrate 20. As a result, good crystal growth is inhibited. Therefore, the normal baking step is conducted after the crystal growth step in order to remove the aforementioned polycrystalline GaN. As for the procedures and conditions of the normal baking step, the internal heater 210 is in the off state, the temperature in the neighborhood of the susceptor 208 is set to the temperature from 1000 to 1200° C., an etching sequence is similar to the etching sequence in the high temperature baking step, and baking is conducted for about 30 to 120 minutes. Since the normal baking step is conducted, the polycrystalline GaN can be removed from the reaction chamber 201.

(Crystal Growth Step)

After the high temperature baking step or the normal baking step is conducted, and upon completion of decrease of the temperature and the purge of inside of the reaction vessel 203, as shown in FIG. 3, the furnace port 221 of the reaction vessel 203 is opened, and the seed crystal substrate 20 is mounted on the susceptor 208. The furnace port 221 is isolated from the atmospheric air and connected to the glove box 220 which is continuously purged with $N_2$ gas. The glove box 220 includes, as described above, a transparent acrylic wall, a plurality of rubber gloves connected to holes penetrating the wall, and a pass box to put an object in and out of the glove box 220. Since the atmospheric air in the pass box is replaced with $N_2$ gas, the object can be put in and out of the glove box 220 without letting the atmospheric air to be incorporated therein. Since the mounting operation of the seed crystal substrate 20 is conducted using such a mechanism, re-contamination of each member in the reaction vessel 203 and re-adhesion of the impurity gas to these members can be prevented, the member being after completion of cleaning and modification through a high temperature baking step described later. The surface of the seed crystal substrate 20 to be mounted on the susceptor 208, that is, the principal surface (crystal growth surface, base surface) on the side facing the nozzles 249a to 249c is to be, for example, (0001) plane, that is, +c-plane (Ga polar plane) of the GaN-crystal.

Figure 4A:
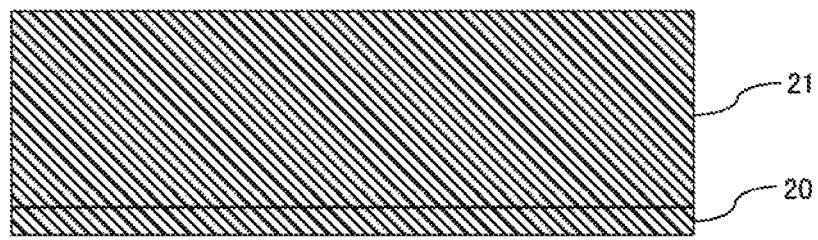
FIG. 4A is a diagram illustrating a state of a GaN-crystal film having been grown thicker on a seed crystal substrate.

Upon completion of loading the seed crystal substrate 20 into the reaction chamber 201, the furnace port 221 is closed, and the supply of $H_2$ gas, or $H_2$ gas and $N_2$ gas into the reaction chamber 201 is started while heating and exhausting the reaction chamber 201. Thereafter, when the temperature and the pressure inside of the reaction chamber 201 reach a desired treatment temperature and a desired treatment pressure to attain a desired atmosphere in the reaction chamber 201, the supply of HCl gas and NH₃ gas from the gas supply pipes 232a, 232b is started, and the GaCl gas and NH₃ gas are respectively supplied to the surface of the seed crystal substrate 20. Accordingly, as shown in a cross-sectional view in FIG. 4A, the GaN-crystal is epitaxially grown on the surface of the seed crystal substrate 20 to form a GaN-crystal film 21.

In this step, the supply of NH₃ gas into the reaction chamber 201 is preferably started before or at the time when the temperature of the seed crystal substrate 20 reaches 500° C., in order to prevent thermal decomposition of the GaN-crystal which constitutes the seed crystal substrate 20. Further, in order to improve in-plane film thickness uniformity or the like of the GaN-crystal film 21, this step is preferably conducted while the susceptor 208 being rotating.

In this step, the temperature of the zone heater 207 is set to, for example, from 700 to 900° C. for the upstream-side heater surrounding the gas generator 233a, whereas the temperature is set to, for example, from 1000 to 1200° C. for the downstream-side heater surrounding the susceptor 208. Accordingly, the temperature of the susceptor 208 is regulated to a predetermined crystal growth temperature from 1000 to 1200° C. In this step, the internal heater 210 may be used in the off state but temperature control may be conducted using the internal heater 210 so long as the temperature of the susceptor 208 is in the aforementioned range from 1000 to 1200° C.

Examples of other treatment conditions of this step include the followings: Treatment pressure: 0.5 to 2 atm; Partial pressure of GaCl gas: 0.1 to 20 kPa; Partial pressure of NH₃ gas/partial pressure of GaCl gas: 1 to 100; and Partial pressure of H₂ gas/partial pressure of GaCl gas: 0 to 100.

Further, when GaCl gas and NH₃ gas are supplied to the surface of the seed crystal substrate 20, N₂ gas may be added as a carrier gas from each of the gas supply pipes 232a to 232c. Since N₂ gas is added to regulate the blowout flow velocity of the gas supplied from the nozzles 249a to 249c, distribution of a supply amount or the like of the source gas on the surface of the seed crystal substrate 20 can be appropriately controlled, and a uniform growth rate distribution across the surface can be attained. Rare gas such as Ar gas or He gas may be supplied in place of N₂ gas.

(Unloading Step)

When the GaN-crystal film 21 is grown to a desired thickness on the seed crystal substrate 20, the supply of HCl gas and H₂ gas into the reaction chamber 201 and heating by the zone heater 207 are respectively stopped while supplying NH₃ gas and N₂ gas into the reaction chamber 201 and exhausting the reaction chamber 201. When the temperature in the reaction chamber 201 is decreased to 500° C. or less, the supply of NH₃ gas is stopped, and atmosphere in the reaction chamber 201 is replaced with N₂ gas and is restored to the atmospheric pressure. Then, the temperature in the reaction chamber 201 is decreased, for example, to a temperature of 200° C. or less, that is, a temperature at which the crystal ingot of the GaN (the seed crystal substrate 20 with the GaN-crystal film 21 formed on the surface) can be unloaded from the reaction vessel 203. Thereafter, the crystal ingot is unloaded from the reaction chamber 201 through the glove box 220 and the pass box.

(Slicing Step)

Figure 4B:
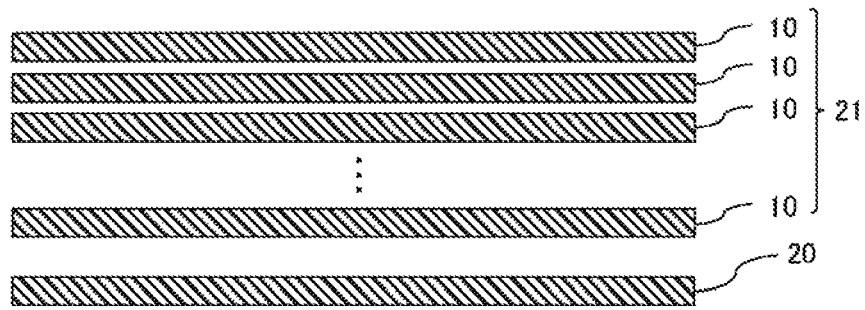
FIG. 4B is a diagram illustrating a state of obtaining plural GaN-substrates by slicing the GaN-crystal film which has been grown thicker.

Since the unloaded crystal ingot is subsequently sliced, for example, in parallel to a growth plane, one or more substrates 10 can be obtained as shown in FIG. 4B. This slicing process can be conducted using, for example, a wire saw or an electric discharge machine. Since the front surface (+c-plane) of the substrate 10 is subsequently subjected to a predetermined abrasive machining, this plane may be processed into an epi-ready, mirror-surface. The rear surface (−c-plane) of the substrate 10 is processed into a lap-surface or a mirror-surface.

The aforementioned high temperature baking step, the normal baking step, the crystal growth step and the unloading step are preferably conducted in the order described below. Namely, for example, the following steps are conducted in the following order: exposing the inside of the reaction chamber 201 and the exchanging chamber 202 to atmospheric air→high temperature baking step→crystal growth step 4 unloading step→(normal baking step→crystal growth step→unloading step)×n, wherein n is an integer of 1 or more.

(3) Effect Obtained by this Embodiment

According to this embodiment, one or more effects shown below may be obtained.

(a) Since the high temperature baking step is conducted while an oxidizing sequence and an etching sequence are alternately repeated under the aforementioned treatment conditions before conducting the crystal growth step, each concentration of Si, B, Fe, O, and C in the GaN-crystal obtained in this embodiment is as extremely small as less than $1×10^{15}$ at/cm³.

The concentrations of these impurities, i.e., Si, B, and Fe are not actually measured concentrations of the respective impurities but indicate the current lower limit of detection in SIMS measurement which is a representative technique of analyzing impurities. In other words, it means that the actual concentrations of the respective impurities can be reduced to a low value which cannot be detected according to the current technique.

In Raster change method, the lower limit of detection is $5×10"$ at/cm³ for the concentration of O and $1×10^{14}$ at/cm³ for the concentration of C. The inventors of the present invention have confirmed that, when the treatment conditions of this embodiment are adjusted within the aforementioned range, for example, when the time for conducting an oxidizing sequence and an etching sequence is set to 60 minutes or more in total and the cycle is repeated four times or more, each concentration of O and C can be less than $5×10^{14}$ at/cm³ while each concentration of Si, B, and Fe in the GaN-crystal can be less than $1×10^{15}$ at/cm³. The inventors of the present invention have confirmed that, when the treatment conditions of this embodiment are adjusted within the aforementioned range, for example, when the time for conducting oxidizing and etching sequences is set to 120 minutes or more in total and the cycle is repeated eight times or more, the concentration of O can be less than $5×10^{14}$ at/cm³ and the concentration of C can be less than $1×10^{14}$ at/cm³ while each concentration of Si, B, and Fe in the GaN-crystal can be less than $1×10^{15}$ at/cm³.

The GaN-crystal obtained according to this embodiment has extremely excellent crystal quality, that is, greatly reduced defect density, dislocation density, compared to the conventional GaN-crystal, for example, the GaN-crystals obtained by the methods disclosed in Patent Documents 1 to 3, which contain these impurities in more amount.

The GaN-crystal obtained in this embodiment is a crystal in which cracks may hardly occur when grown into a thick film or subjected to a slicing process. The reason is considered that reduced concentration of impurities relative to the conventional concentration of impurities increases hardness of the GaN crystal and thus suppresses plastic deformation of the crystal during growing ingot. In order to measure a hardness of the crystal, a nanoindentation method is suitable in which the maximum load is within a range of 1 mN or more and 50 mN or less.

Investigation of a hardness of the GaN crystal according to the present method has confirmed that a hardness of the crystal never exceeds 22 GPa and is, for example, in a range between 19.7 and 21.8 GPa when the crystal contains at least any one of B, Fe, O, and C at the concentration of $1\times10^{15}$ at/cm$^3$ or more.

On the other hand, it has been confirmed that, when each concentration of B, Fe, O, and C in the GaN-crystal is less than $1\times10^{15}$ at/cm$^3$, as is in this embodiment, a hardness of the crystal exceeds 22.0 GPa and is, for example, as extremely high as 22.5 GPa. It has also been confirmed that, when each concentration of B and Fe is less than $1\times10^{15}$ at/cm$^3$ and each concentration of O and C is less than $5\times10^{14}$ at/cm$^3$ in the GaN-crystal, a hardness of the crystal exceeds 22.5 GPa and is, for example, as extremely high as 23.2 GPa. It has also been confirmed that, when each concentration of B and Fe is less than $1\times10^{15}$ at/cm$^3$, concentration of O is less than $5\times10^{14}$ at/cm$^3$ and concentration of C is less than $1\times10^{14}$ at/cm$^3$ in the GaN-crystal, a hardness of the crystal exceeds 23.2 GPa and is, for example, as extremely high as 25.5 GPa. Incidentally, it has been confirmed that addition of Si at the concentration within a range of $1\times10^{15}$ at/cm$^3$ to $1\times10^{19}$ at/cm$^3$ has no remarkable effect on a hardness of the GaN-crystal.

In view of foregoing, the GaN-crystal according to this embodiment is sliced to obtain a substrate 10, and when the resulting substrate is used to fabricate a semiconductor device, diffusion of the impurities may be suppressed compared to a case of using a substrate comprising the conventional GaN-crystal which contains more impurities, and, as a result, improved property and prolonged service life of the device can be obtained. Moreover, since a hardness of the GaN crystal is increased, occurrence of cracks can be prevented both when ingot is grown and when ingot is sliced. As a result, both ingot and the substrate 10 may be produced with high yield.

(b) Since the GaN-crystal obtained according to this embodiment is a high purity crystal as described above, it possesses high insulation property, i.e., electric resistivity of $1\times10^6$ Ωcm or more under a temperature condition of 20° C. or more and 300° C. or less. Namely, when the GaN-crystal contains a large amount of donor impurities such as Si or O, there is known a method, as disclosed in Japanese Unexamined Patent Application Publication No. 2007-534580, of adding into the crystal donor-compensating impurities (hereinafter referred to as compensating impurities) such as Mn, Fe, cobalt (Co), Ni, copper (Cu) in order to improve the insulation property of the crystal. However, this method is disadvantageously accompanied by a problem in that, upon addition of the compensating impurities, the quality of the GaN-crystal is degraded and a hardness of the crystal is decreased. For example, when the compensating impurities are added into the GaN-crystal, a crack is likely to occur in a substrate obtained by slicing the crystal. Further, when the compensating impurities are diffused over the laminated structure formed on the substrate, the quality of the semiconductor device fabricated using this substrate is more likely to be degraded. In contrast, the GaN-crystal according to this embodiment enables to obtain high insulation property without adding the compensating impurities, and as a result, a problem of degraded crystallinity which is likely to be problematic in a conventional method can be avoided.

(c) The insulation property of the GaN-crystal obtained according to this embodiment is less temperature dependent and more stable compared to the insulation property obtained by adding an impurity for compensating into the crystal. Indeed, it seems that an insulation property similar to that of the GaN-crystal according to this embodiment can be imparted upon addition of Fe to a GaN-crystal containing Si or O at concentration of, for example, $1\times10^{17}$ at/cm$^3$ or more, concentration of Fe exceeding the concentration of Si or O. However, the level of Fe which is used as a compensating impurity is as relatively low as about 0.6 eV. Therefore, the insulation property obtained upon addition of Fe may be characteristically more easily deteriorated with increasing temperature, compared to the insulation property of the GaN-crystal according to this embodiment. On the contrary, according to this embodiment, the insulation property can be attained without adding the compensating impurity. Accordingly, the problem of increased temperature dependency may be avoided which is frequently problematic in the conventional method. The GaN-crystal obtained according to this embodiment is of high insulation property, that is, electric resistivity is $1\times10^6$ Ωcm or more under a temperature condition of 20° C. or more and 300° C. or less, and further electric resistivity is $1\times10^5$ Ωcm under a temperature condition of exceeding 300° C. and 400° C. or less.

(d) The GaN-crystal obtained according to this embodiment has high purity as described above. Accordingly, when the crystal is made into an n-type semiconductor by Si ion implantation or when the crystal is made into a p-type semiconductor by Mg ion implantation, an amount of implanted ion can be reduced. In other words, the GaN-crystal according to this embodiment is more advantageous compared to the conventional GaN-crystal which contains more impurities such as Fe, in that a desired semiconductor property can be imparted while suppressing degradation of the crystal resulting from ion implantation as much as possible. In addition, the GaN-crystal according to this embodiment is more advantageous compared to the conventional GaN-crystal containing more impurities also in that the GaN-crystal according to this embodiment has extremely low concentration of impurities which may cause a carrier scattering, and thus can avoid reduced mobility of the carrier.

(e) When members forming at least the aforementioned high temperature reaction area 201a in the reaction chamber 201 include a non-O-containing heat resistant material such as SiC or graphite, the concentration of O in the GaN-crystal to be grown on the seed crystal substrate 20 can be further reduced. Accordingly, the quality of the GaN-crystal can be further improved, and hence the insulation property can be further improved.

(f) In the reaction chamber 201, when members forming at least the aforementioned high temperature reaction area 201a include a non-C-containing heat resistant material such as alumina, the concentration of C in the GaN-crystal to be grown on the seed crystal substrate 20 can be further reduced. In this way, the quality of the GaN-crystal can be further improved.

Second Embodiment of the Present Invention

Next, the second embodiment of the present invention will be explained mainly on the difference from the first embodiment.

The GaN-crystal in this embodiment is similar to the GaN-crystal in the first embodiment in that each concentration of Si, B, O and C is less than $1\times10^{15}$ at/cm$^3$, but different from the GaN-crystal in the first embodiment in that the concentration of Fe is relatively large, i.e., $1\times10^{16}$ at/cm$^3$ or more. Since the GaN-crystal in this embodiment contains Fe at such a concentration, it has a greater insulation property compared to that of the GaN-crystal in the first embodiment, i.e., an electric resistivity is $1\times10^7$ Ωcm or more under a temperature condition of 20° C. or more and 300° C. or less. The concentration of Fe may be set to, for example, $1\times10^{16}$ at/cm$^3$ or more and $1\times10^{19}$ at/cm$^3$ or less. In this case, the electric resistivity is, for example, $1\times10^7$ Ωcm or more and $5\times10^{10}$ Ωcm or less under a temperature condition of 20° C. or more and 300° C. or less.

A Fe-containing gas such as Cp$_2$Fe gas may be supplied along with the source gas (GaCl gas+NH$_3$ gas) from the gas supply pipe 232c to the seed crystal substrate 20 to add Fe into the GaN-crystal, in the aforementioned crystal growth step. The partial pressure ratio of a Fe-containing gas to a group-III source gas (partial pressure of a Fe-containing gas/partial pressure of total GaCl gas) in the reaction vessel 203 may be, for example, 1/10$^6$ to 1/100. Use of a dopant gas is advantageous in that Fe can be added uniformly across the total area in the direction of thickness of the GaN-crystal, and further, in that it becomes easier to avoid damage posed on the surface of the crystal compared to ion implantation described later.

FeCl$_3$ gas may be used in place of Cp$_2$Fe gas. For example, a metallic iron may be placed in a high temperature area at around 800° C. in the middle of the gas supply pipe 232c and HCl gas may be passed therethrough to generate FeCl$_3$ gas. It is advantageous to use FeCl$_3$ gas in place of Cp$_2$Fe gas in that incorporation of the C component included in Cp$_2$Fe gas into the crystal, that is, increase in the C concentration in the GaN-crystal may be more easily avoided.

Alternatively, the substrate 10 may be obtained in the same manner as in the first embodiment, then Fe ion may be implanted to the resulting substrate 10 to add Fe into the GaN crystal. It is advantageous to use ion implantation in that incorporation of the C component included in Cp$_2$Fe gas into the crystal, that is, increase in the C concentration in the GaN-crystal may be more easily avoided.

Compared to the conventional GaN-crystal containing more impurities, the GaN-crystal obtained according to this embodiment has a better quality since each concentration of Si, B, O and C in the crystal is extremely small like the GaN-crystal according to the first embodiment. According to this embodiment, since the concentration of Fe in the GaN-crystal may be increased as described above, its insulation property can be enhanced compared to that of the GaN-crystal according to the first embodiment.

Third Embodiment of the Present Invention

Next, the third embodiment of the present invention will be explained mainly on the difference from the first embodiment.

The GaN-crystal in this embodiment is similar to the GaN-crystal of the first embodiment in that each concentration of B, Fe, O and C in the crystal is less than $1\times10^{15}$ at/cm$^3$, but different from the GaN-crystal of the first embodiment in that the concentration of Si is $1\times10^{15}$ at/cm$^3$ or more. Since the GaN-crystal in this embodiment contains Si at such a concentration, it has conductive property, that is, an electric resistivity of $1\times10^2$ Ωcm or less under a temperature condition of 20° C. or more and 300° C. or less, and functions as a so-called n-type semiconductor crystal. For example, the Si concentration may be $1\times10^{15}$ at/cm$^3$ or more and $5\times10^{19}$ at/cm$^3$ or less. In this case, the n-type carrier concentration under a temperature condition of 20° C. or more and 300° C. or less is, for example, $1\times10^{15}$/cm$^3$ or more and $5\times10^{19}$/cm$^3$ or less, and the electric resistivity is, for example, $1\times10^4$ Ωcm or more and 100 Ωcm or less under the same temperature conditions.

In the GaN-crystal according to this embodiment, the Si concentration and the n-type carrier concentration were almost the same value in the crystal. This indicates that the actual concentration of the impurity, from which a carrier is derived, other than Si (Fe or C which compensates an n-type carrier, O which serves as a donor, or the like) is extremely small, and the GaN-crystal contains such an impurity in only a negligible amount compared to the minimum value of the Si concentration in this embodiment, i.e. $1\times10^{15}$ at/cm$^3$. Although the SIMS measurement can only reveal that each concentrations of B, Fe, O and C is in the order of less than $10^{15}$ at/cm$^3$ and the concentrations of other impurities are less than the lower limit of detection, the concentrations of Si and the n-type carrier in the crystal are indicated as almost the same values, which means that the actual concentration of these impurities is in the order of $10^{14}$ at/cm$^3$ or less.

A Si-containing gas such as SiH$_4$ gas or SiH$_2$Cl$_2$ gas may be supplied along with the source gas (GaCl gas+NH$_3$ gas) to the seed crystal substrate 20 to add Si into the GaN-crystal, in the aforementioned crystal growth step. The partial pressure ratio of a Si-containing gas to a group-III source gas in the reaction vessel 203 (partial pressure of a Si-containing gas/partial pressure of total GaCl gas) may be, for example, 1/10$^8$ to 1/10$^3$. Further, the substrate 10 may be obtained in the same manner as in the first embodiment, and then Si ion may be implanted to the resulting substrate 10 to add Si into the GaN-crystal.

Compared to the conventional GaN-crystal containing more impurities, the GaN-crystal obtained according to this embodiment has a better quality since each concentration of B, Fe, O and C in the crystal is extremely small like the GaN-crystal according to the first embodiment. According to this embodiment, since the concentration of impurities such as Fe in the GaN-crystal is small as described above, a desired conductive property (n-type semiconductor property) may be imparted to the GaN-crystal even when an amount of the Si to be added is suppressed. —Further, the GaN-crystal according to this embodiment is more advantageous compared to the conventional GaN-crystal containing more impurities in that the GaN-crystal according to this embodiment has extremely low concentration of impurities which may cause a carrier scattering, and thus can avoid reduced mobility of the carrier. It has also been confirmed that the similar effect may be obtained using Ge alternative to or in addition to Si as an n-type dopant.

Variation of the Third Embodiment of the Present Invention

In the third embodiment mentioned above, since the amount of a Si-containing gas to be supplied in the crystal growth step is further reduced, the n-type carrier concentration may be $1\times10^{14}$ to $1\times10^{15}$ at/cm$^3$. In this case, however, the Si concentration in the crystal cannot be measured. Only what can be said at present is that the Si concentration is less than $1\times10^{15}$ at/cm$^3$. Ge may be used alternative to or in addition to Si as an n-type dopant.

Fourth Embodiment of the Present Invention

Next, the fourth embodiment of the present invention will be explained mainly on the difference from the first embodiment.

The GaN-crystal according to this embodiment is similar to the first embodiment in that each concentration of Si, B, Fe, O and C in the crystal is less than $1\times10^{15}$ at/cm$^3$, but is different from the first embodiment in that it further contains Mg at the concentration of $3\times10^{18}$ at/cm$^3$ or more. Since the GaN-crystal in this embodiment contains Mg at such a concentration, it has conductive property where electric resistivity is less than $1\times10^{2}$ Ωcm under a temperature condition of 20° C. or more and 300° C. or less, and functions as a so-called p-type semiconductor crystal. The concentration of Mg may be, for example, $3\times10^{18}$ at/cm$^3$ or more and $5\times10^{20}$ at/cm$^3$ or less. In this case, the concentration of the p-type carrier is, for example, $2\times10^{17}$/cm$^3$ or more and $5\times10^{18}$/cm$^3$ or less under a temperature condition of 20° C. or more and 300° C. or less, the electric resistivity is, for example, 0.5 Ωcm or more and 100 Ωcm or less under the same temperature conditions.

A Mg-containing gas such as Cp$_2$Mg gas may be supplied along with the source gas (GaCl gas+NH$_3$ gas) to the seed crystal substrate 20 to add Mg into the GaN-crystal, in the aforementioned crystal growth step. The partial pressure ratio of a Mg-containing gas to a group-III source gas in the reaction vessel 203 (partial pressure of a Mg-containing gas/partial pressure of total GaCl gas) may be, for example, $1/10^5$ to $1/10^2$. Further, in order to add Mg into the GaN-crystal, a gas containing magnesium nitride (Mg$_3$N$_2$) or metallic Mg may be used in place of Cp$_2$Mg gas or the like. Regarding these gases, for example, Mg$_3$N$_2$ or metallic Mg may be placed in a high temperature area at about 800° C. in the middle of the gas supply pipe 232c to generate vapor of these materials. Alternatively, the substrate 10 may be obtained in the same manner as in the first embodiment and thereafter Mg ion may be implanted to this substrate 10 to add Mg into the GaN-crystal. Similar to the second embodiment, use of a dopant gas is advantageous in that Mg can be added uniformly across the total area in the direction of thickness of the GaN-crystal, and further, in that it becomes easier to avoid damage posed on the surface of the crystal attributable to the ion implantation. It is also advantageous to use ion implantation in that incorporation of the C component included in Cp$_2$Mg gas, that is, increase in the C concentration in the GaN-crystal may be more easily avoided.

Compared to the conventional GaN-crystal containing more impurities, the GaN-crystal obtained according to this embodiment has a better quality since each concentration of Si, B, Fe, O and C in the crystal is extremely small like the GaN-crystal according to the first embodiment. According to this embodiment, since the concentration of impurities such as Si, O in the GaN-crystal is small as described above, a desired conductive property (p-type semiconductor property) may be imparted to the GaN-crystal even when an amount of the Mg to be added is suppressed. The GaN-crystal according to this embodiment is more advantageous compared to the conventional GaN-crystal containing more impurities such as Si or O in that a desired semiconductor property may be imparted while suppressing degradation of crystal quality resulting from Mg addition as much as possible. Further, the GaN-crystal according to this embodiment is more advantageous compared to the conventional GaN-crystal containing more impurities in that the GaN-crystal according to this embodiment has extremely low concentration of impurities which may cause a carrier scattering, and thus can avoid reduced mobility of the carrier.

Other Embodiments of the Present Invention

The embodiments of the present invention have been specifically explained. However, the present invention is not construed to be limited to the aforementioned embodiments, and various changes may be made without departing from the gist of the invention.

(a) The present invention can be suitably applied to growth of not only GaN, but also, for example, a group-III nitride crystal such as aluminum nitride (AlN), aluminum gallium nitride (AlGaN), indium nitride (InN), indium gallium nitride (InGaN), or aluminum indium gallium nitride (AlInGaN), that is, a crystal represented by the composition formula of In$_x$Al$_y$Ga$_{1-x-y}$N (satisfying 0≤x≤1, 0≤y≤1, 0≤x+y≤1).

(b) The crystal growth step of the present invention may include not only the method explained in the aforementioned embodiment but also a combination of the following methods.

For example, since dimension and shape of a gas generator are optimized, stay (contact) time of HCl gas on the Ga melt may be extended (e.g., to 1 minute or more) and the concentration of impurities contained in GaCl gas may be further reduced. Alternatively, for example, a nano mask, which includes a plurality of micropores having ability to capture impurities formed thereon and contains titanium nitride (TiN), is pre-formed on a seed crystal substrate, and the GaN-crystal may be grown thereon. Alternatively, for example, when crystal growth is progressed on the seed crystal substrate, a growth period in a facet state rather than on a c-plane can be shortened, in which state impurity is easily incorporated. As mentioned above, when facet growth is conducted on the seed crystal substrate, it is preferable to obtain the substrate 10 by growing the GaN layer thicker, peeling the resultant from the seed crystal substrate, and removing the crystal which has been grown in a facet state on the heterogeneous substrate side.

According to the methods described in the first to fourth embodiments, such methods by themselves can greatly reduce the concentration of impurities in the GaN-crystal as described above. In addition, the concentration of impurities in the crystal may be more reliably reduced by using the method in combination with an auxiliary method described herein.

(c) The GaN-crystal obtained according to the present invention is not limited to the case where it is constituted as a substrate, but also may be a crystal layer constituting a part of a semiconductor device.

For example, since any one layer of a semi-insulating layer comprising the semi-insulating crystals described in the first and second embodiments, an n-type semiconductor layer comprising the n-type semiconductor crystal described in the third embodiment, and a p-type semiconductor layer comprising the p-type semiconductor crystal described in the fourth embodiment is arbitrarily combined and layered (junction), various semiconductor devices can be fabricated.

Specifically, since a laminate structure including a junction-plane (pn-junction plane) between the p-type semiconductor layer and n-type semiconductor layer mentioned above is fabricated, this laminate structure may be made function as a pn-junction diode. Alternatively, since a laminate structure including a junction-plane (Schottky barrier junction-plane) between either of the p- and n-type semiconductor layers mentioned above and a metal layer containing metal is fabricated, this laminate structure may be made function as a Schottky barrier diode. In order to form the p-type semiconductor layer or the n-type semiconductor layer, as described above, a doping gas may be used to add Si or Mg into the crystal. Alternatively, Si or Mg ion implantation to the semi-insulating layer may be conducted. Alternatively, since Fe or C ion implantation is conducted to the semi-insulating layer, the n-type semiconductor layer, and the p-type semiconductor layer described in the respective embodiments described above, these layers may be made function as an element isolating layer (insulating layer) for inter-elements insulation of the elements formed on the substrate.

EXAMPLES

The experimental results supporting the effect of the embodiments described above will be hereinafter explained. (Temperature Dependency of Electric Resistivity)

Figure 2:
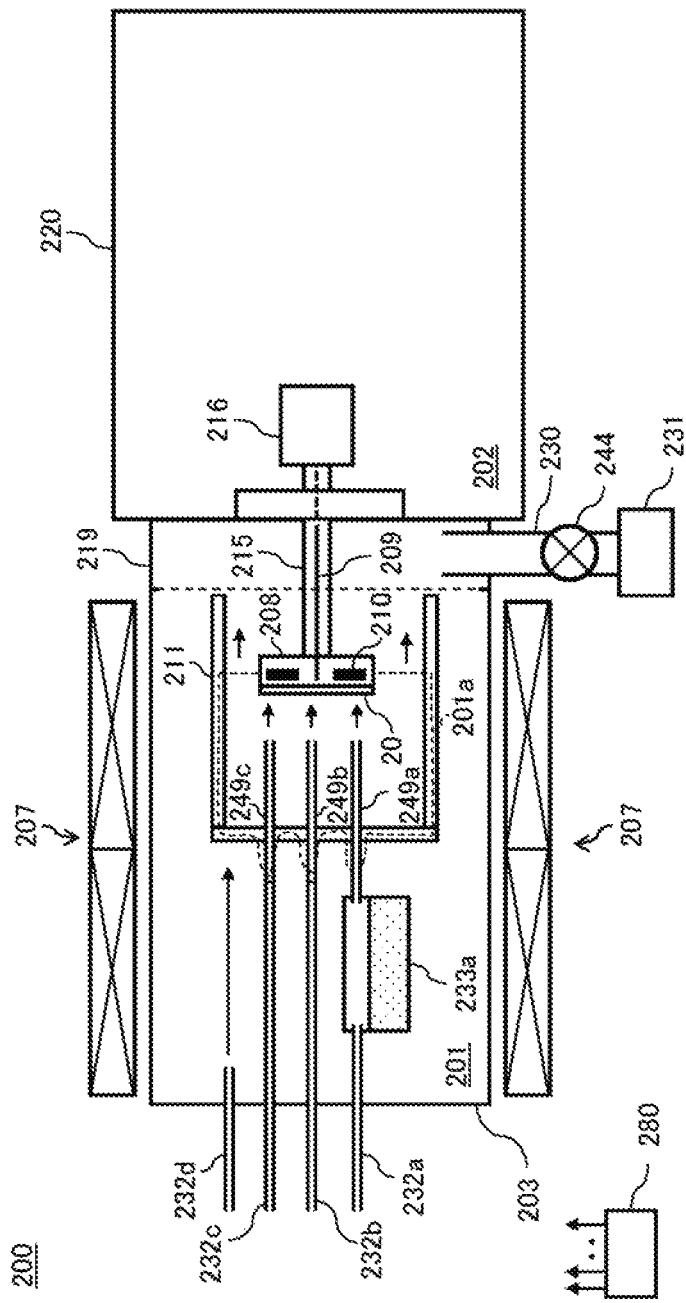
FIG. 2 is a schematic block diagram of a vapor phase growth apparatus, illustrating a state of conducting a step of crystal growth in a reaction vessel.

As samples 1 to 7, the GaN-single crystal was grown to the thickness of 2 mm on a seed crystal substrate comprising a GaN-single crystal using an HVPE apparatus shown in FIG. 2.

In order to confirm effect of impurity removal, a reaction chamber 201 and an exchanging chamber 202 were released to an atmospheric air before growing all of the samples. In order to prepare samples 1 to 5, the high temperature baking step of alternately repeating an oxidizing sequence and an etching sequence was conducted before the crystal growth step. The temperature conditions of the high temperature baking step were 1600° C., 1500° C., 1500° C., 1400° C., 1100° C. in the order from sample 1 to sample 5. All the pressure conditions were set to 1 atm. Partial pressure of $O_2$ gas was within the scope of the treatment conditions described in the first embodiment mentioned above, and common to the samples 1 to 5. Other treatment conditions were within the scope of the treatment conditions described in the first embodiment mentioned above, and common to the samples 1 to 5.

When samples 6 and 7 were prepared, the aforementioned high temperature baking step was not conducted before the crystal growth step. Other treatment conditions were common to the preparations of samples 1 to 5.

In any of samples 1 to 7, the GaN-crystal was grown so that its surface became a mirror-surface. However, in samples 4 to 7 which had not been subjected to the high temperature baking at 1500° C. or more, there occurred a slight crack in the crystal. In samples 1 to 3 which had been subjected to the high temperature baking step at 1500° C. or more, there occurred no crack in the GaN-crystal.

In the crystal growth step to prepare samples 1 and 3 to 5, Fe was not added to the GaN-crystal to be grown on the seed crystal substrate. On the other hand, in the crystal growth step to prepare samples 2, 6, and 7, Fe was added to the GaN-crystal to be grown on the seed crystal substrate. The concentration of Fe in the GaN-crystal in the samples 2, 6, and 7 were $1\times10^{16}$ at/cm$^3$, $1\times10^{19}$ at/cm$^3$, and $1\times10^{18}$ at/cm$^3$, in this order. Other treatment conditions were within the scope of the treatment conditions described in the first embodiment mentioned above, and common to the samples 1 to 7.

Next, each GaN crystal of samples 1 to 7 was evaluated for temperature dependency of electric resistivity. The evaluation results are illustrated in FIG. 5. In FIG. 5, the horizontal axis represents temperature (° C.) of the GaN in the measurement of the electric resistivity, and the longitudinal axis represents the electric resistivity (Ωcm) of the GaN crystal. In figure, ◇, *, Δ, □, ○, •, and ■ represent evaluation results of samples 1 to 7 in this order.

As can be seen from FIG. 5, mutual comparison of samples 1 to 5 reveals that the sample whose temperature condition in the high temperature baking step is set to 1500° C. or more (e.g., samples 1 to 3) exhibits higher electric resistivity, that is, higher insulation property under any temperature conditions, compared to the sample whose temperature condition in the high temperature baking step is set to less than 1500° C. (e.g., samples 4 and 5). Specifically, it is found that electric resistivity is $1\times10^6$ Ωcm or more under a temperature condition of 20° C. or more and 300° C. or less in samples 1 to 3, whereas electric resistivity is less than $1\times10^6$ Ωcm under the same temperature condition in other samples. It is also found that electric resistivity is $1\times10^5$ Ωcm or more under a temperature condition of exceeding 300° C. and 400° C. or less in samples 1 to 3, whereas electric resistivity is less than $1\times10^5$ Ωcm under the same temperature condition in other samples. It is because since the temperature conditions in the high temperature baking step was set to the aforementioned condition, the concentrations of various impurities contained in the GaN crystal could be reduced.

Moreover, comparison between samples 2 and 3 reveals that sample 2 with Fe added thereto exhibits higher insulation property than sample 3 with no Fe added thereto. As can be seen, if the temperature in the high temperature baking step is set to almost the same temperature, addition of Fe at the concentration of $1\times10^{16}$ at/cm$^3$ or more into the GaN crystal may further enhance insulation property. In other words, addition of Fe may provide the same effect as in the case where temperature condition in the high temperature baking step is raised. According to an additional experiment of the inventors of the present invention, it has been confirmed that electric resistivity of the GaN-crystal under a temperature condition of 20° C. or more and 300° C. or less is raised, for example, up to a range of $1\times10^8$ Ωcm or more and $5\times10^{10}$ Ωcm or less, when each concentration of Si, B, O and C is less than $1\times10^{15}$ at/cm$^3$ and the concentration of Fe is a predetermined concentration of $1\times10^{16}$ at/cm$^3$ or more and $1\times10^{19}$ at/cm$^3$ or less.

In addition, comparison of samples 1 to 5 with samples 6, 7 reveals that in samples 1 to 5 which are subjected to the high temperature baking step including an oxidizing sequence, electric resistivity is less likely to be reduced with increasing temperature, that is, insulation property has lower temperature dependency, compared to samples 6, 7 which are not subjected to the high temperature baking step. As in samples 6, 7, addition of Fe at the concentration of $1\times10^{17}$ at/cm$^3$ or more may be likely to accompanied by reduced insulation property with increasing temperature although the insulation property under low temperature condition may be enhanced. The reason is as described above. On the other hand, samples 1 to 3 whose temperature condition in the high temperature baking step is 1500° C. or more exhibit insulation property similar to or exceeding insulation property of samples 6, 7. In addition, the insulation property is extremely stable due to its low temperature dependency.

Once released to atmospheric air, crystal growth was continuously repeated without conducting release to atmospheric air between crystal growths as follows: crystal growth→normal baking→crystal growth→normal baking . . . . After crystal growth as described above was repeated 30 to 50 times and measurement of electric property was conducted, almost the same result as described above was obtained. Namely, once the high temperature baking step had been conducted, all of the GaN crystals which had been subsequently grown continued to exhibit high electric resistivity unless released to atmospheric air. On the contrary, when the high temperature baking was not conducted after released to atmospheric air, electric resistivity remained low no matter how many times crystal growth and normal baking were repeated. Regarding behavior during Fe doping, it is necessary to dope Fe at high concentration to enhance insulation property when the high temperature doping is not conducted. In that case, electric resistivity was found to exhibit relatively greater temperature dependency. On the other hand, it was found that samples 1 to 3 which had been subjected to the high temperature baking step at 1500° C. or more exhibited insulation property similar to or exceeding those of samples 6, 7, and that insulation property was extremely stable due to its low temperature dependency.
(Baking Temperature and Atmosphere Dependency of Concentration of Impurities)

Subsequently, as samples 8 to 16, the GaN-single crystal was grown to the thickness of 5 mm on a seed crystal substrate including a GaN-single crystal using the HVPE apparatus shown in FIG. 2. In order to confirm effect of impurity removal, a reaction chamber and an exchanging chamber were released to an atmospheric air before growing all of the samples.

In preparing samples 8 to 11, the high temperature baking step of conducting an etching sequence alone without conducting an oxidizing sequence before the crystal growth step was conducted, and thereafter the GaN-single crystal was grown on the seed crystal substrate without releasing the inside of the reaction vessel to atmospheric air. The temperature conditions of the high temperature baking step were 1100° C., 1400° C., 1500° C., 1600° C., in the order from sample 8 to sample 11. All the pressure conditions were set to 1 atm.

In preparing samples 12 to 16, the aforementioned high temperature baking step of alternately repeating an oxidizing sequence and an etching sequence was conducted before conducting the crystal growth step, and thereafter the GaN-single crystal was grown on the seed crystal substrate without releasing the inside of the reaction vessel to atmospheric air. The temperature conditions of the high temperature baking step were 1100° C., 1400° C., 1500° C., 1550° C., 1600° C. in the order from sample 12 to sample 16. All the pressure conditions were set to 1 atm. Partial pressure of $O_2$ gas was within the scope of the treatment conditions described in the first embodiment mentioned above, and common to the samples 12 to 16.

Further, regarding sample 17, HVPE device in which the inner wall of the reaction vessel and surfaces of members inside the reaction vessel were coated with pBN (pyrolytic boron nitride) was used to grow the GaN-single crystal on the seed crystal substrate. In preparing sample 17, the high temperature baking step of alternately repeating an oxidizing sequence and an etching sequence was not conducted before conducting the crystal growth step.

In the crystal growth step to prepare samples 8 to 17, impurities such as Fe were not added into the GaN-crystal. Other treatment conditions were within the scope of the treatment conditions described in the first embodiment mentioned above, and common to the samples 8 to 17.

After completion of the crystal growth, each GaN crystal of samples 8 to 17 was evaluated for the concentration of impurities contained therein using SIMS. The results are shown in Tables 1 to 3. The right-side columns in Tables 1 to 3 indicate the measuring method employed for SIMS (depth profile or Raster change) and the current lower limit in this order. In tables, DL indicates that the measurement result was less than the lower limit of detection.

TABLE 1

| Sample No. | 8 | 9 | 10 | 11 | Measurement Method | Lower Limit of Detection |
|---|---|---|---|---|---|---|
| Baking Temperature | 1100° C. | 1400° C. | 1500° C. | 1600° C. | — | — |
| Oxidizing Sequence | Not included | ← | ← | ← | — | — |
| Etching Sequence | Included | ← | ← | ← | — | — |
| Concentration of Si (at/cm³) | $2 \times 10^{17}$ | $2 \times 10^{15}$ | DL | DL | Depth profile | $1 \times 10^{15}$ |
| Concentration of B (at/cm³) | DL | DL | DL | DL | Depth profile | $1 \times 10^{15}$ |
| Concentration of Fe (at/cm³) | DL | DL | DL | DL | Depth profile | $1 \times 10^{15}$ |
| Concentration of O (at/cm³) | $5 \times 10^{16}$ | $1 \times 10^{16}$ | $4.5 \times 10^{15}$ | $3 \times 10^{15}$ | Raster change | $5 \times 10^{14}$ |
| Concentration of C (at/cm³) | $3 \times 10^{16}$ | $8 \times 10^{15}$ | $3.5 \times 10^{15}$ | $2 \times 10^{15}$ | Raster change | $1 \times 10^{14}$ |
| Hardness (GPa) | 19.7 | 20.2 | 21.2 | 21.5 | | |

TABLE 2

| Sample No. | 12 | 13 | 14 | 15 | 16 | Measurement Method | Lower Limit of Detection |
|---|---|---|---|---|---|---|---|
| Baking Temperature | 1100° C. | 1400° C. | 1500° C. | 1550° C. | 1600° C. | — | — |
| Oxidizing Sequence | Included | ← | ← | ← | ← | — | — |

TABLE 2-continued

| Sample No. | 12 | 13 | 14 | 15 | 16 | Measurement Method | Lower Limit of Detection |
|---|---|---|---|---|---|---|---|
| Etching Sequence | Included | ← | ← | ← | ← | — | — |
| Concentration of Si (at/cm$^3$) | $1.5 \times 10^{17}$ | $1.5 \times 10^{15}$ | DL | DL | DL | Depth profile | $1 \times 10^{15}$ |
| Concentration of B (at/cm$^3$) | DL | DL | DL | DL | DL | Depth profile | $1 \times 10^{15}$ |
| Concentration of Fe (at/cm$^3$) | DL | DL | DL | DL | DL | Depth profile | $1 \times 10^{15}$ |
| Concentration of O (at/cm$^3$) | $4.5 \times 10^{16}$ | $1.5 \times 10^{15}$ | $5.5 \times 10^{14}$ | DL | DL | Raster change | $5 \times 10^{14}$ |
| Concentration of C (at/cm$^3$) | $3.0 \times 10^{16}$ | $7.0 \times 10^{14}$ | $2.5 \times 10^{14}$ | $1.5 \times 10^{14}$ | DL | Raster change | $1 \times 10^{14}$ |
| Hardness (GPa) | 19.5 | 21.8 | 22.5 | 23.2 | 25.5 | | |

TABLE 3

| Sample No. | 17(pBN) | Measurement Method | Lower Limit Of Detection |
|---|---|---|---|
| Baking Temperature | Not conducted | — | — |
| Oxidizing Sequence | Not included | — | — |
| Etching Sequence | Not included | — | — |
| Concentration of Si (at/cm$^3$) | DL | Depth profile | $1 \times 10^{15}$ |
| Concentration of B (at/cm$^3$) | $2 \times 10^{16}$ | Depth profile | $1 \times 10^{15}$ |
| Concentration of Fe (at/cm$^3$) | DL | Depth profile | $1 \times 10^{15}$ |
| Concentration of O (at/cm$^3$) | $1.0 \times 10^{16}$ | Raster change | $5 \times 10^{14}$ |
| Concentration of C (at/cm$^3$) | $1.0 \times 10^{16}$ | Raster change | $1 \times 10^{14}$ |
| Hardness (Gpa) | 19.8 | | |

As shown in Tables 1 and 2, in samples 8 and 12 (temperature in the high temperature baking: 1100° C.) and samples 9 and 13 (temperature in the high temperature baking: 1400° C.), although each concentration of B and Fe was reduced, concentration of Si reached $2 \times 10^{17}$ at/cm$^3$, concentration of O reached $5 \times 10^{16}$ at/cm$^3$, and concentration of C reached $5 \times 10^{16}$ at/cm$^3$. In these samples which had not been subjected to the high temperature baking at 1500° C. or more, the growth plane of the GaN-crystal became a mirror plane but had a slight crack occurred therein due to incorporated impurities.

Moreover, as shown in Tables 1 and 2, since the surfaces of the members in the reaction vessel were coated with pBN, each concentration of Si and Fe was reduced but B was incorporated at the concentration of $2 \times 10^{16}$ at/cm$^3$, in the GaN-crystal of sample 17. Further, since sample 17 had not been subjected to the aforementioned high temperature baking step of alternately conducting an oxidizing sequence and an etching sequence, each concentration of O and C reached up to $1 \times 10^{16}$ at/cm$^3$. In sample 17, the growth plane of the GaN-crystal became a mirror plane but had a lot of cracks occurred in the GaN-crystal due to incorporated B or the like.

In view of the foregoing, it is found that a high purity crystal in which all of Si, B, Fe, O, and C exist in extremely low concentration, for example, a high purity crystal in which each concentration of Si, B, and Fe is less than $1 \times 10^{15}$ at/cm$^3$ and each concentration of O and C is less than $5 \times 10^{15}$ at/cm$^3$ cannot be obtained by simply combining the methods described in Patent Documents 1 to 3, that is, a method using a high purity gas as a source gas or a carrier gas and a method including coating an inner wall of a crystal growth furnace.

Tables 1 and 2 reveal that the higher the temperature condition in the high temperature baking step, the more the concentration of impurities contained in the GaN crystal tends to be reduced. In samples 10, 11, 14 to 16 which had been subjected to the high temperature baking step at 1500° C. or more, there was no crack occurred in the GaN crystal probably because of reduction in the concentration of impurities.

In addition, in samples 10 and 11 which had been subjected to the high temperature baking step including only an etching sequence without an oxidizing sequence, each concentration of Si, B, and Fe was less than the lower limit of detection (less than $1 \times 10^{15}$ at/cm$^3$) but each concentration of O and C exceeded $1 \times 10^{15}$ at/cm$^3$. On the other hand, in samples 14 to 16 which had been subjected to the high temperature baking step which included alternately conducting an oxidizing sequence and an etching sequence, each concentration of Si, B, O, C, and Fe was less than the lower limit of detection (less than $1 \times 10^{15}$ at/cm$^3$).

In view of the foregoing, it is found that, in order to grow a high purity crystal in which each concentration of Si, B, Fe, O, and C is less than $1 \times 10^{15}$ at/cm$^3$, it is required not only to set the temperature condition to 1500° C. or more but also to alternately repeat an oxidizing sequence and an etching sequence, in the high temperature baking step.

In an additional experiment, the thickness of the GaN crystal grown on the seed crystal substrate was increased to 8 mm. As a result, the effect of the concentration of impurities was more significantly produced. Specifically, when high purity crystal was grown employing procedures and treatment conditions so that each concentration of B, Fe, O and C was less than $1 \times 10^{15}$ at/cm$^3$, that is, employing procedures and treatment conditions similar to those of preparing samples 14 to 16, there was no crack found in the resulting crystal. A hardness of these crystals exceeded 22.0 GPa, as determined by a nanoindentation method which measures using a diamond indenter having a tip diameter of several tens of millimeters with maximum load of a predetermined magnitude within a range of 1 mN or more and 50 mN or less.

On the other hand, when high purity crystal was grown employing procedures and treatment conditions so that concentration of at least any one of B, Fe, O and C exceeded $1 \times 10^{15}$ at/cm$^3$, that is, employing the procedures and treatment conditions similar to those of preparing samples 8 to 13 and 17, there occurred cracks more or less in the resulting crystal. It is considered because the higher concentration of impurities deteriorated a crystal and reduced a hardness of the crystal. A hardness of these crystals was 21.8 GPa or less, as determined by a nanoindentation method which measures using a diamond indenter having a tip diameter of several tens of millimeters with maximum load of a predetermined magnitude within a range of 1 mN or more and 50 mN or less.

It has been confirmed that addition of Si at the concentration in a range from $1\times10^{15}$ at/cm$^3$ to $1\times10^{19}$ at/cm$^3$ has no significant effect on a hardness of the GaN-crystal, that is, can suppress occurrence of cracks, so long as each concentration of B, Fe, O and C is less than $1\times10^{15}$ at/cm$^3$. A hardness of these crystals exceeded 22.0 GPa, as determined by a nanoindentation method which measures using an indenter having a tip diameter of several tens of millimeters with maximum load of a predetermined magnitude within a range of 1 mN or more and 50 mN or less.

Once released to atmospheric air, crystal growth was continuously repeated without conducting release to atmospheric air between crystal growths as follows: crystal growth→normal baking→crystal growth→normal baking . . . . After crystal growth as described above was repeated 30 to 50 times and measurement of electric property was conducted, almost the same result as described above was obtained. Namely, once the high temperature baking had been conducted, all of the GaN-crystals which had been subsequently grown maintained impurity concentration less than the lower limit of detection unless released to atmospheric air. On the contrary, when the high temperature baking was not conducted after released to atmospheric air, the concentration of impurities never became less than the lower limit of detection no matter how many times crystal growth and normal baking were repeated.

Preferred Aspect of the Present Invention

Hereinafter, supplementary descriptions of the preferred aspects of the present invention will be given.
(Supplementary Description 1)
According to an aspect of the present invention,
there is provided a nitride crystal,
in which each concentration of silicon B, O, and C is less than $1\times10^{15}$ at/cm$^3$ in the crystal, and
which is a crystal represented by a composition formula of $In_xAl_yGa_{1-x-y}N$ (satisfying $0\leq x\leq 1$, $0\leq y\leq 1$, $0\leq x+y\leq 1$).
(Supplementary Description 2)
There is provided the crystal according to supplementary description 1, wherein preferably each concentration of Si and Fe in the crystal is less than $1\times10^{15}$ at/cm$^3$.
(Supplementary Description 3)
There is provided the crystal according to supplementary description 2, wherein preferably electric resistivity is $1\times10^6$ Ωcm or more under a temperature condition of 20° C. or more and 300° C. or less.
(Supplementary Description 4)
There is provided the crystal according to supplementary description 1, wherein preferably concentration of Si is less than $1\times10^{15}$ at/cm$^3$ and concentration of Fe is $1\times10^{16}$ at/cm$^3$ or more in the crystal.
(Supplementary Description 5)
There is provided the nitride crystal according to supplementary description 4, wherein electric resistivity is $1\times10^7$ Ωcm or more under a temperature condition of 20° C. or more and 300° C. or less.
(Supplementary Description 6)
There is provided the nitride crystal according to supplementary description 1, wherein concentration of Fe is less than $1\times10^{15}$ at/cm$^3$ and concentration of Si or Ge or total concentration of Si and Ge is $1\times10^{15}$ at/cm$^3$ or more in the crystal. Preferably, the concentration of Si or Ge or the total concentration of Si and Ge is $5\times10^{19}$ at/cm$^3$ or less.
(Supplementary Description 7)
There is provided the nitride crystal according to supplementary description 6, wherein electric resistivity is $1\times10^2$ Ωcm or less under a temperature condition of 20° C. or more and 300° C. or less. Preferably, the electric resistivity is $1\times10^{-4}$ Ωcm or more under the aforementioned temperature condition. Preferably, the concentration of a n-type carrier is $1\times10^{15}$/cm$^3$ or more and $5\times10^{19}$/cm$^3$ or less under the aforementioned temperature condition.
(Supplementary Description 8)
There is provided the nitride crystal according to supplementary description 2, wherein electric resistivity is $1\times10^2$ Ωcm or less under a temperature condition of 20° C. or more and 300° C. or less. Preferably, the electric resistivity is $1\times10^{-4}$ Ωcm or more under the aforementioned temperature condition. Preferably, the concentration of an n-type carrier is $1\times10^{14}$/cm$^3$ or more and less than $1\times10^{15}$/cm$^3$ under the aforementioned temperature condition.
(Supplementary Description 9)
There is provided the nitride crystal according to supplementary description 2, wherein concentration of Mg in the crystal is $1\times10^{17}$ at/cm$^3$ or more. Preferably, the concentration of Mg in the crystal is $5\times10^{20}$ at/cm$^3$ or less.
(Supplementary Description 10)
There is provided the nitride crystal according to supplementary description 9, wherein electric resistivity is $1\times10^2$ Ωcm or less under a temperature condition of 20° C. or more and 300° C. or less. Preferably, the electric resistivity is 0.5 Ωcm or more and 100 Ωcm or less under the aforementioned temperature condition. Preferably, the concentration of a p-type carrier under the aforementioned temperature condition is $2\times10^{17}$/cm$^3$ or more and $5\times10^{18}$/cm$^3$ or less.
(Supplementary Description 11)
There is provided a nitride crystal (semi-insulating crystal or semiconductor crystal),
which is a crystal represented by a composition formula of $In_xAl_yGa_{1-x-y}N$ (satisfying $0\leq x\leq 1$, $0\leq y\leq 1$, $0\leq x+y\leq 1$) with a hardness exceeding 22.0 GPa as measured by a nanoindentation method using an indenter with a maximum load applied thereto being within a range of 1 mN or more and 50 mN or less.
(Supplementary Description 12)
There is provided the crystal according to supplementary description 11, wherein preferably a hardness is 22.5 GPa or more as measured by a nanoindentation method using an indenter with a maximum load applied thereto being within the range of 1 mN or more and 50 mN or less.
(Supplementary Description 13)
There is provided the crystal according to supplementary description 11 or 12, wherein preferably a hardness is 23.2 GPa or more as measured by a nanoindentation method using an indenter with a maximum load applied thereto being within the range of 1 mN or more and 50 mN or less.
(Supplementary Description 14)
There is provided the crystal according to any one of the supplementary descriptions 1 to 13, wherein preferably each concentration of O and C in the crystal is less than $5\times10^{14}$ at/cm$^3$.
(Supplementary Description 15)
There is provided the crystal according to any one of the supplementary descriptions 1 to 13, wherein preferably the concentration of O is less than $5\times10^{14}$ at/cm$^3$ and the concentration of C is less than $1\times10^{14}$ at/cm$^3$ in the crystal.
(Supplementary Description 16)

According to another aspect of the present invention, there is provided a semiconductor device, which is the device having at least one layer of a semi-insulating layer comprising the crystal according to supplementary descriptions 2 to 5, an n-type semiconductor layer comprising the crystal according to supplementary descriptions 6 to 8, and a p-type semiconductor layer comprising the crystal according to supplementary description 9 or 11.

(Supplementary Description 17)

There is provided the device according to supplementary description 16, preferably having a junction plane (pn-junction plane) between the p-type semiconductor layer and the n-type semiconductor layer and serving as a pn-junction diode.

(Supplementary Description 18)

There is provided the device according to supplementary description 16, preferably having a junction plane (Schottky junction plane) between either of the p- and the n-type semiconductor layers and a metallic layer comprising metal and serving as a Schottky barrier diode.

(Supplementary Description 19)

There is provided the device according to any one of supplementary descriptions 16 to 18, preferably having a layer with a predetermined semiconductor property imparted thereto by Si or Mg ion implantation into the semiconductor layer.

(Supplementary Description 20)

There is provided the device according to any one of supplementary descriptions 16 to 19, preferably having a layer for inter-element insulation by Fe or C ion implantation into the semiconductor layer.

(Supplementary Description 21)

According to another aspect of the present invention, there is provided a planar nitride crystal substrate, which is the substrate comprising the crystal according to any one of supplementary descriptions 1 to 15 and having a thickness of 250 μm or more and a diameter of 25 mm or more.

(Supplementary Description 22)

According to another aspect of the present invention, there is provided a method of manufacturing a nitride crystal, including:

a crystal growth step of loading a seed crystal substrate and raw materials containing a group-III element into a reaction vessel, supplying a halide of the raw material and a nitriding agent to the seed crystal substrate heated to a predetermined crystal growth temperature, and thereby growing the group-III nitride crystal on the seed crystal substrate; and a high temperature baking step of:

raising a temperature of an area in the reaction vessel to 1500° C. or more, the area being heated to at least around the crystal growth temperature, which is a high temperature reaction area not partitioned from the area into which the seed crystal substrate is loaded, and possibly in contact with the gas supplied to the seed crystal substrate;

not conducting supply of the nitriding agent into the reaction vessel, but conducting supply of hydrogen gas, a halogen-based gas, and an oxygen-containing gas into the reaction vessel; and cleaning and modifying a surface of a member forming the high temperature reaction area, wherein the high temperature baking step is conducted before conducting the crystal growth step.

(Supplementary Description 23)

There is provided the method according to supplementary description 22, wherein preferably a member at least a surface of which contains quartz-free and boron-free material is used as the member forming the high temperature reaction area.

(Supplementary Description 24)

There is provided the method according to supplementary description 22 or 23, wherein preferably a member at least a surface of which contains at least any one of alumina, silicon carbide, graphite, and tantalum carbide is used as the member forming the high temperature reaction area.

(Supplementary Description 25)

There is provided the method according to any one of supplementary descriptions 22 to 24, wherein, in the high temperature baking step, a pressure in the reaction vessel is maintained at a pressure of 0.5 atm or more and 2 atm or less. Preferably, in the high temperature baking step, the temperature of at least the high temperature reaction area in the reaction vessel is maintained at a temperature of 1500° C. or more. Preferably, the high temperature baking step is conducted while exhausting the reaction vessel. Preferably, the high temperature baking treatment is conducted for 30 minutes or more.

(Supplementary Description 26)

There is provided the method according to any one of supplementary descriptions 22 to 25, wherein, in the high temperature baking step, an oxidizing sequence and an etching sequence are alternately repeated, wherein an oxygen-containing gas and an inert gas are supplied into the reaction vessel in the oxidizing sequence, and an etching gas and hydrogen gas are supplied into the reaction vessel in the etching sequence.

(Supplementary Description 27)

There is provided the method according to supplementary description 26, wherein, in the high temperature baking step, a total period for conducting the oxidizing sequence and the etching sequence is 30 minutes or more (preferably 60 minutes or more, and more preferably 120 minutes or more). Further, in the high temperature baking step, a cycle of alternately conducting the oxidizing sequence and the etching sequence is repeated twice or more (preferably 4 times or more, and more preferably 8 times or more).

(Supplementary Description 28)

There is provided the method according to supplementary description 26 or 27, wherein, in the oxidizing sequence, partial pressure of an oxygen-containing gas in the reaction vessel is in a range of 0.1% or more and 5% or less of a total partial pressure of gases including hydrogen gas and halogen gas and excluding an oxygen-containing gas.

EXPLANATION OF REFERENCE NUMERALS

10 Substrate
20 Seed crystal substrate
21 GaN-crystal film

The invention claimed is:

1. A nitride crystal represented by the composition formula of $In_xAl_yGa_{1-x-y}N$ (satisfying $0 \le x \le 1$, $0 \le y \le 1$, $0 \le x+y \le 1$), with a hardness exceeding 22.0 GPa as measured by a nanoindentation method using an indenter with a maximum load applied thereto being within a range of 1 mN or more and 50 mN or less.

2. The nitride crystal according to claim 1, wherein the hardness is 22.5 GPa or more as measured by a nanoindentation method with a maximum load in the range of 1 mN or more and 50 mN or less.

3. The nitride crystal according to claim 1, wherein the hardness is 23.2 GPa or more as measured by a nanoindentation method with a maximum load in the range of 1 mN or more and 50 mN or less.

\* \* \* \* \*

UNITED STATES PATENT AND TRADEMARK OFFICE
CERTIFICATE OF CORRECTION

PATENT NO. : 11,008,671 B2
APPLICATION NO. : 16/420499
DATED : May 18, 2021
INVENTOR(S) : Hajime Fujikura et al.

Page 1 of 1

It is certified that error appears in the above-identified patent and that said Letters Patent is hereby corrected as shown below:

In the Specification

Column 14, Line 41, "$5\times10$" at/cm$^3$ for the concentration" should read --$5\times10^{14}$ at/cm$^3$ for the concentration--

Column 18, Line 8, "$1\times10^4$ Ωcm or more" should read --$1\times10^{-4}$ Ωcm or more--

Column 21, Line 60, "were $1\times10^{\prime 6}$ at/cm$^3$," should read --were $1\times10^{16}$ at/cm$^3$,--

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*